United States Patent
Wang et al.

(10) Patent No.: US 12,366,334 B2
(45) Date of Patent: *Jul. 22, 2025

(54) LED-FILAMENT COMPRISING A LIGHT SCATTERING MATERIAL LAYER

(71) Applicant: Bridgelux, Inc., Fremont, CA (US)

(72) Inventors: Gang Wang, Sunnyvale, CA (US);
Jun-Gang Zhao, Fremont, CA (US);
Yi-Qun Li, Danville, CA (US)

(73) Assignee: Bridgelux, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/378,609

(22) Filed: Oct. 10, 2023

(65) Prior Publication Data

US 2024/0117946 A1   Apr. 11, 2024

Related U.S. Application Data

(63) Continuation of application No. 17/543,639, filed on Dec. 6, 2021, now Pat. No. 11,781,714, which is a (Continued)

(51) Int. Cl.
*F21K 9/232* (2016.01)
*C09K 11/61* (2006.01)
(Continued)

(52) U.S. Cl.
CPC ............ *F21K 9/232* (2016.08); *C09K 11/617* (2013.01); *C09K 11/77348* (2021.01);
(Continued)

(58) Field of Classification Search
CPC . H01L 33/504; H01L 25/0753; H01L 33/502; H01L 33/54; H01L 33/508;
(Continued)

(56) References Cited

U.S. PATENT DOCUMENTS

| 5,998,925 A | 12/1999 | Shimizu et al. |
| 6,069,440 A | 5/2000 | Shimizu et al. |

(Continued)

FOREIGN PATENT DOCUMENTS

| CN | 1326230 A | 12/2001 |
| CN | 1719633 A | 1/2006 |

(Continued)

OTHER PUBLICATIONS

U.S. Appl. No. 15/282,551, filed May 25, 2017, Zhu et al.
(Continued)

*Primary Examiner* — David Chen
(74) *Attorney, Agent, or Firm* — Shirley A. Recipon

(57) ABSTRACT

An LED-filament comprising: a partially light transmissive substrate; a plurality of LED chips on a front face of the substrate; a photoluminescence material that is in direct contact with and covers all of the plurality of LED chips; and a light scattering layer that is in direct contact with and covers at least the photoluminescence material, wherein the light scattering layer comprises particles of light scattering material, and wherein the photoluminescence material comprises broadband green to red photoluminescence materials and narrowband red photoluminescence material.

17 Claims, 16 Drawing Sheets

Related U.S. Application Data continuation-in-part of application No. 16/540,019, filed on Aug. 13, 2019, now Pat. No. 11,342,311.

(60) Provisional application No. 62/831,699, filed on Apr. 9, 2019, provisional application No. 62/820,249, filed on Mar. 18, 2019.

(51) Int. Cl.

| | | |
|---|---|---|
| *C09K 11/77* | (2006.01) | |
| *H01L 25/075* | (2006.01) | |
| *H10H 20/851* | (2025.01) | |
| H10H 20/80 | (2025.01) | |
| H10H 20/856 | (2025.01) | |

(52) U.S. Cl.
CPC ...... *C09K 11/7774* (2013.01); *H01L 25/0753* (2013.01); *H10H 20/8513* (2025.01); *H10H 20/856* (2025.01); *H10H 20/882* (2025.01)

(58) Field of Classification Search
CPC . H01L 2933/0091; H01L 33/50; F21K 9/232; H10H 20/8513; H10H 20/856; H10H 20/882; F21Y 2115/10
USPC ............... 257/88, 89, 98, E21.502, E33.056; 438/27

See application file for complete search history.

(56) References Cited

U.S. PATENT DOCUMENTS

| | | | |
|---|---|---|---|
| 6,791,259 | B1 | 9/2004 | Stokes et al. |
| 8,529,791 | B2 | 9/2013 | Wu et al. |
| 8,547,010 | B2 | 10/2013 | Jagt |
| 8,597,545 | B1 | 12/2013 | Liu et al. |
| 8,604,678 | B2 | 12/2013 | Dai et al. |
| 8,614,539 | B2 | 12/2013 | Dai et al. |
| 8,663,502 | B2 | 3/2014 | Tao |
| 8,710,754 | B2 | 4/2014 | Baddela et al. |
| 8,890,403 | B2 | 11/2014 | Sakuta et al. |
| 8,957,585 | B2 | 2/2015 | Li et al. |
| 9,261,242 | B2 | 2/2016 | Ge et al. |
| 9,752,734 | B2 | 9/2017 | Tanda et al. |
| 9,967,943 | B1 | 5/2018 | Wang et al. |
| 10,026,874 | B1 | 7/2018 | Li et al. |
| 10,468,564 | B1 | 11/2019 | Zhao et al. |
| 10,479,937 | B2 | 11/2019 | Zhu et al. |
| 10,495,263 | B2 | 12/2019 | Chowdhury et al. |
| 10,535,805 | B2 | 1/2020 | Li et al. |
| 10,568,172 | B2 | 2/2020 | Li et al. |
| 10,950,585 | B2 | 3/2021 | Li et al. |
| 11,781,714 | B2 | 10/2023 | Wang et al. |
| 2004/0124758 | A1 | 7/2004 | Danielson et al. |
| 2004/0150991 | A1 | 8/2004 | Ouderkirk et al. |
| 2005/0116635 | A1 | 6/2005 | Walson et al. |
| 2005/0242326 | A1 | 11/2005 | Comanzo et al. |
| 2007/0045761 | A1 | 3/2007 | Basin et al. |
| 2007/0080364 | A1 | 4/2007 | Hsiung |
| 2007/0108888 | A1 | 5/2007 | Chen et al. |
| 2007/0125984 | A1 | 6/2007 | Tian et al. |
| 2007/0139949 | A1 | 6/2007 | Tanda et al. |
| 2008/0079015 | A1 | 4/2008 | Krummacher |
| 2009/0057699 | A1 | 3/2009 | Basin et al. |
| 2010/0013373 | A1 | 1/2010 | Hata et al. |
| 2010/0124243 | A1 | 5/2010 | Hussell et al. |
| 2010/0142189 | A1 | 6/2010 | Hong et al. |
| 2010/0163892 | A1 | 7/2010 | Liu |
| 2010/0277069 | A1 | 11/2010 | Janik et al. |
| 2010/0289044 | A1 | 11/2010 | Krames et al. |
| 2011/0001157 | A1 | 1/2011 | McKenzie et al. |
| 2011/0068354 | A1 | 3/2011 | Tran et al. |
| 2011/0227469 | A1 | 9/2011 | Yuan et al. |
| 2012/0032219 | A1 | 2/2012 | Ooyabu et al. |
| 2012/0087105 | A1* | 4/2012 | Dai .................. F21V 13/08 362/355 |
| 2012/0217862 | A1 | 8/2012 | Matsuda et al. |
| 2012/0218746 | A1 | 8/2012 | Winton |
| 2012/0275157 | A1 | 11/2012 | Hsu |
| 2012/0306340 | A1 | 12/2012 | Hoetzl et al. |
| 2013/0069089 | A1 | 3/2013 | Hussell et al. |
| 2013/0111744 | A1 | 5/2013 | Tischler et al. |
| 2013/0147348 | A1* | 6/2013 | Motoya ............... H01L 25/0753 313/498 |
| 2013/0193465 | A1 | 8/2013 | Xu et al. |
| 2013/0264937 | A1 | 10/2013 | Sakuta et al. |
| 2013/0277694 | A1 | 10/2013 | Sakuta et al. |
| 2013/0320363 | A1 | 12/2013 | Pan et al. |
| 2014/0103373 | A1 | 4/2014 | Li et al. |
| 2014/0159612 | A1 | 6/2014 | Tong |
| 2014/0167601 | A1 | 6/2014 | Harry et al. |
| 2014/0198373 | A1 | 7/2014 | Ray |
| 2014/0231857 | A1 | 8/2014 | Nammalwar et al. |
| 2014/0353704 | A1 | 12/2014 | Kamikawa |
| 2014/0362565 | A1* | 12/2014 | Yao .................... H01L 25/0753 362/223 |
| 2015/0008835 | A1 | 1/2015 | Sugiura et al. |
| 2015/0035430 | A1 | 2/2015 | Yoshida et al. |
| 2015/0069442 | A1 | 3/2015 | Liu et al. |
| 2015/0084086 | A1 | 3/2015 | Hsu et al. |
| 2015/0270449 | A1 | 9/2015 | Park et al. |
| 2015/0280080 | A1 | 10/2015 | Wada et al. |
| 2015/0329770 | A1 | 11/2015 | Kaneyoshi et al. |
| 2015/0357528 | A1 | 12/2015 | Tsumori et al. |
| 2015/0364659 | A1 | 12/2015 | Setlur et al. |
| 2016/0097495 | A1 | 4/2016 | Yamamoto et al. |
| 2016/0116124 | A1 | 4/2016 | Podowitz et al. |
| 2016/0161067 | A1 | 6/2016 | Oepts et al. |
| 2016/0177178 | A1 | 6/2016 | Choi et al. |
| 2016/0202555 | A1 | 7/2016 | Tanaka |
| 2016/0233387 | A1 | 8/2016 | Kitano et al. |
| 2016/0233393 | A1 | 8/2016 | Okuno et al. |
| 2016/0254416 | A1 | 9/2016 | Cheng |
| 2016/0351757 | A1 | 12/2016 | Yoshimura et al. |
| 2016/0372638 | A1 | 12/2016 | Todorov et al. |
| 2017/0125650 | A1 | 5/2017 | Pickett et al. |
| 2017/0145310 | A1 | 5/2017 | Li et al. |
| 2017/0222107 | A1 | 8/2017 | Chen et al. |
| 2017/0236982 | A1 | 8/2017 | Akiyama et al. |
| 2017/0283695 | A1 | 10/2017 | Yoshida et al. |
| 2018/0040786 | A1 | 2/2018 | Chen |
| 2018/0053882 | A1 | 2/2018 | Cheng et al. |
| 2018/0204984 | A1 | 7/2018 | Li et al. |
| 2018/0212128 | A1 | 7/2018 | Hayashi |
| 2018/0219144 | A1 | 8/2018 | Perkins et al. |
| 2018/0226549 | A1 | 8/2018 | Nakabayashi et al. |
| 2018/0287019 | A1 | 10/2018 | Hashimoto et al. |
| 2018/0315899 | A1 | 11/2018 | Li et al. |
| 2018/0328543 | A1 | 11/2018 | Bergmann et al. |
| 2019/0139943 | A1 | 5/2019 | Tiwari et al. |
| 2019/0194537 | A1 | 6/2019 | Sekiguchi et al. |
| 2019/0198719 | A1 | 6/2019 | Fujioka et al. |
| 2019/0198722 | A1 | 6/2019 | Nakabayashi et al. |
| 2019/0013304 | A1 | 10/2019 | Luo et al. |
| 2020/0056747 | A1 | 2/2020 | Jiang et al. |
| 2020/0058835 | A1 | 2/2020 | Rintamaki et al. |
| 2020/0066949 | A1 | 2/2020 | Jiang et al. |
| 2020/0088355 | A1 | 3/2020 | Dutta et al. |
| 2020/0176646 | A1 | 6/2020 | Li et al. |
| 2020/0287102 | A1 | 9/2020 | Bertram et al. |
| 2020/0303355 | A1 | 9/2020 | Wang et al. |

FOREIGN PATENT DOCUMENTS

| | | |
|---|---|---|
| CN | 1818012 A | 8/2006 |
| CN | 103547858 A | 1/2014 |
| CN | 103615677 A | 3/2014 |
| CN | 103904197 A | 7/2014 |
| CN | 104781942 A | 7/2015 |
| CN | 102439682 B | 3/2016 |
| CN | 103717701 B | 8/2016 |
| CN | 205542866 U | 8/2016 |
| CN | 106459756 A | 2/2017 |
| CN | 207350041 U | 5/2018 |
| CN | 108475714 A | 8/2018 |

(56) References Cited

FOREIGN PATENT DOCUMENTS

| | | |
|---|---|---|
| CN | 108561764 A | 9/2018 |
| CN | 207906894 U | 9/2018 |
| CN | 208871526 U | 5/2019 |
| CN | 209196573 U | 8/2019 |
| CN | 110234926 A | 9/2019 |
| CN | 110388612 A | 10/2019 |
| CN | 209558063 U | 10/2019 |
| CN | 111279763 A | 6/2020 |
| CN | 111615753 A | 9/2020 |
| DE | 102016105211 A1 | 9/2017 |
| EP | 2629341 A1 | 8/2013 |
| EP | 2747157 B1 | 3/2016 |
| EP | 3226313 A1 | 10/2017 |
| EP | 3279952 A1 | 2/2018 |
| EP | 3568630 A1 | 11/2019 |
| JP | 2007005781 A | 1/2007 |
| JP | 2011129661 A | 6/2011 |
| JP | 2016042579 A | 3/2016 |
| JP | 2016076699 A | 5/2016 |
| JP | 2017520917 A | 7/2017 |
| JP | 2018056552 A | 4/2018 |
| JP | 2018113411 A | 7/2018 |
| JP | 2016072614 B | 5/2019 |
| KR | 101683270 B1 | 12/2016 |
| TW | 201306318 A | 2/2013 |
| TW | M467186 U | 12/2013 |
| TW | 201510440 A | 3/2015 |
| TW | I730680 B | 6/2021 |
| WO | 2008044171 A2 | 4/2008 |
| WO | 2010053341 A1 | 5/2010 |
| WO | 2011138707 A1 | 11/2011 |
| WO | 2015015363 A1 | 2/2015 |
| WO | 2017044380 A1 | 3/2017 |
| WO | 2017062314 A1 | 4/2017 |
| WO | 2018132778 A1 | 7/2018 |
| WO | 2019005597 A1 | 1/2019 |
| WO | 2019118959 A1 | 6/2019 |
| WO | 2020015420 A1 | 1/2020 |
| WO | PCTUS2023095 | 3/2020 |
| WO | 2020190921 A1 | 9/2020 |
| WO | 2020190960 A9 | 10/2020 |

OTHER PUBLICATIONS

U.S. Appl. No. 16/540,019, filed Aug. 13, 2019, Gang Wang.
U.S. Appl. No. 16/669,449, filed Oct. 30, 2019, Gang Wang.
U.S. Appl. No. 16/734,822, filed Jan. 6, 2020, Gang Wang.
U.S. Appl. No. 17/543,639, filed Dec. 6, 2021, Gang Wang.
CN202080035454, Office Action, Sep. 14, 2023.
Office Action Mar. 18, 2020; CN app. No. 201880007010.4.
European Search Opinion, Jul. 2020, EP18738546.
International Search Report, PCT/US2018/038928.
International Search Report, PCT/US2020/023095.
International Search Report, PCT/US2020/023110.
International Search Report, PCT/US2020/023187.
IPRP, PCT/US2018/065952.
Office Action, Apr. 2021; EP18738546.
Office Action, CN 202080035454.6, Sep. 2023.
Office Action, CN 202080036613, Sep. 2023.
Office Action, CN201880086608; Mar. 2023.
Office Action, JP2023-035861, Nov. 14, 2023.
Office Action, TW109109012, Jan. 2021.
Office Action, TW109109069, Oct. 30, 2020.
Supplementary European Search Report, Jul. 2020. EP18738546.
TW Office Action, Oct. 2020, App. No. 109109011.
Written Opinion, PCT/US2018/038928.
Written Opinion, PCT/US2018/065952.
Written Opinion, PCT/US2020/023095.
Written Opinion, PCT/US2020/023110.
Written Opinion, PCT/US2020/023187.
CN 202080035977—Office Action, Jul. 2024.
DuPont: Polymers, Light and the Science of TiO2; 2007.
DuPont: Titanium Dioxide for Coatings; 2007.
Johnson, Robert W., et. al.; Light-scattering efficiency of white pigments: an analysis of model core-shell pigments vs. optimized rutile TiO2; TAPPI Journal, vol. 80: No. 11; Nov. 1997.
Ross, William D.; Theoretical Light-Scattering Power of TiO2 and Microvoids; Ind. Eng. Chem., Prod. Res. Develop., vol. 13, No. 1, 1974.
Thiele, Erik S. and French, Roger H.; Computation of Light Scattering by Anisotropic Spheres of Rutile Titania; Adv. Mater. 1998, 10, No. 15 (1998).
Thiele, Erik S. and French, Roger H.; Light-Scattering Properties of Representative, Morphological Rutile Titania Particles Studied Using a Finite-Element Method, J. Am. Ceram. Soc., 81 [3] 469-479 (1998).
Office Action, CN202080035977, Jul. 2024.

\* cited by examiner

SECTION A - A

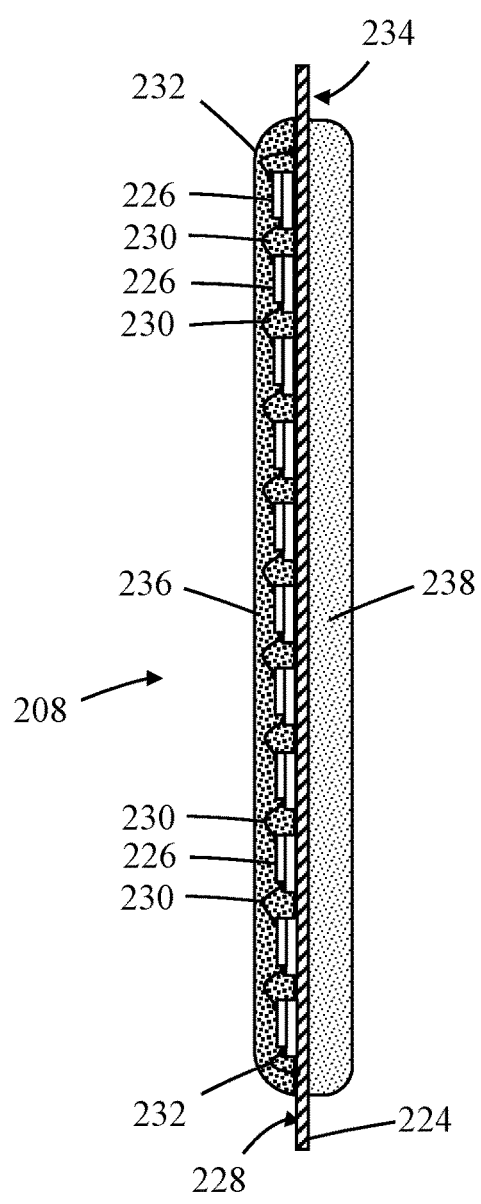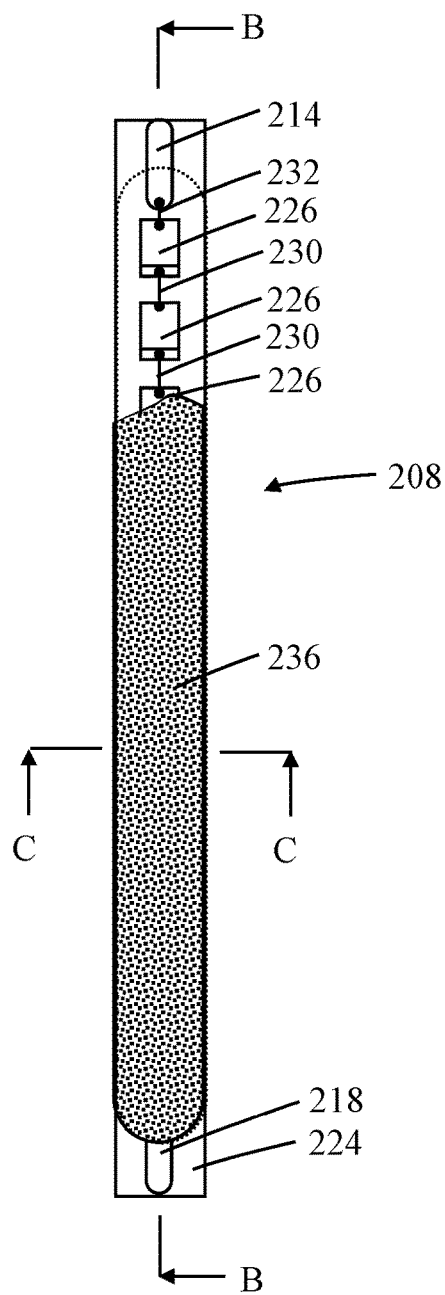
SECTION B-B
FIG. 2A
FIG. 2B

SECTION C-C

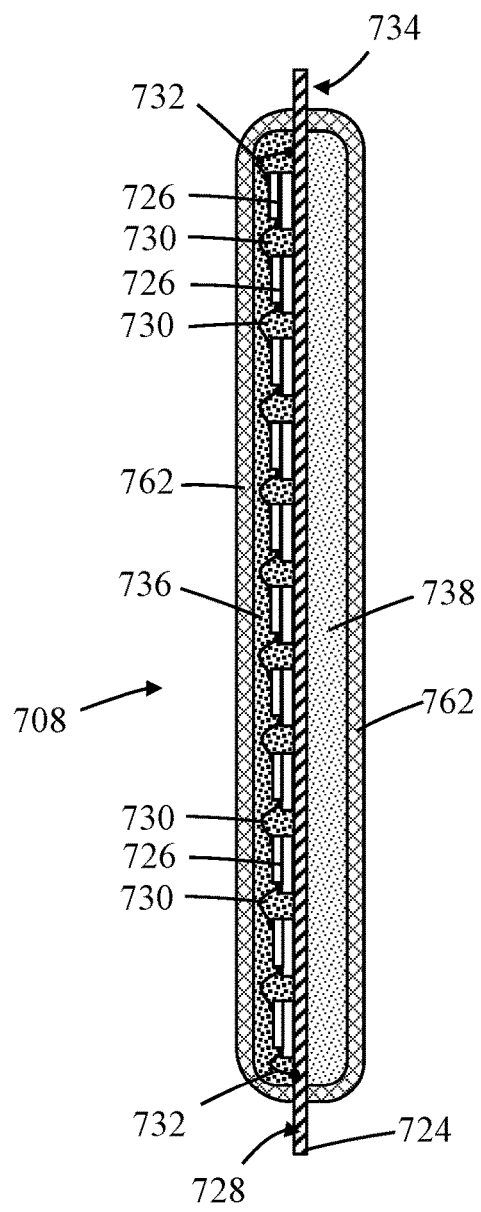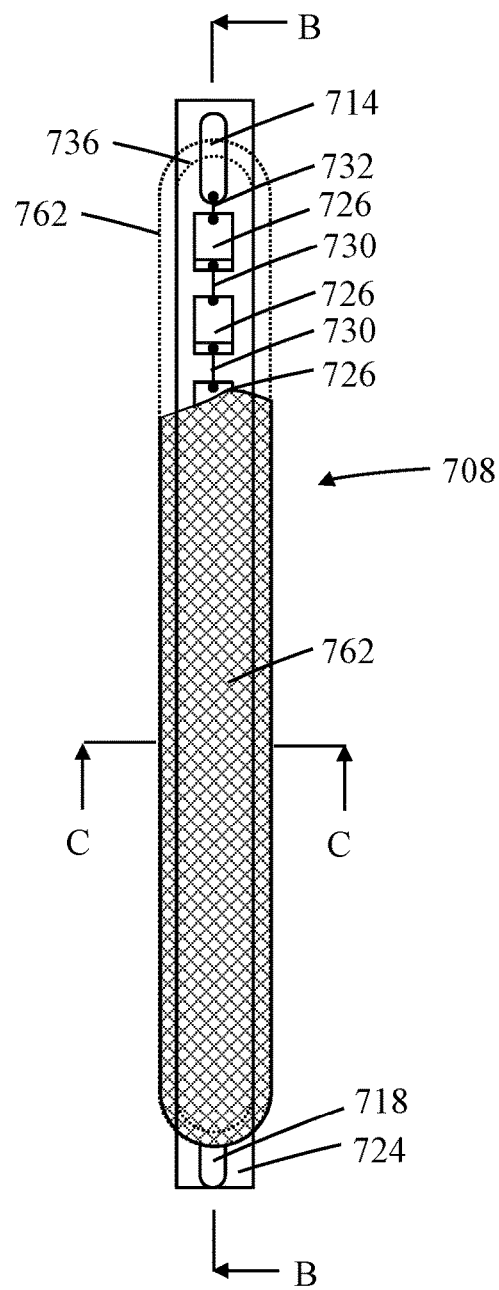
SECTION B-B
FIG. 7A
FIG. 7B

SECTION C-C

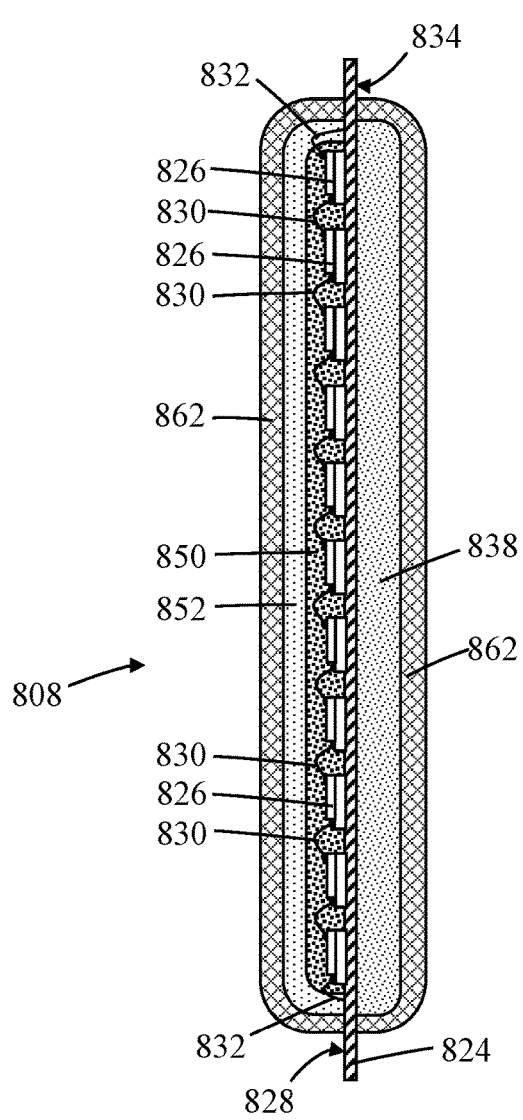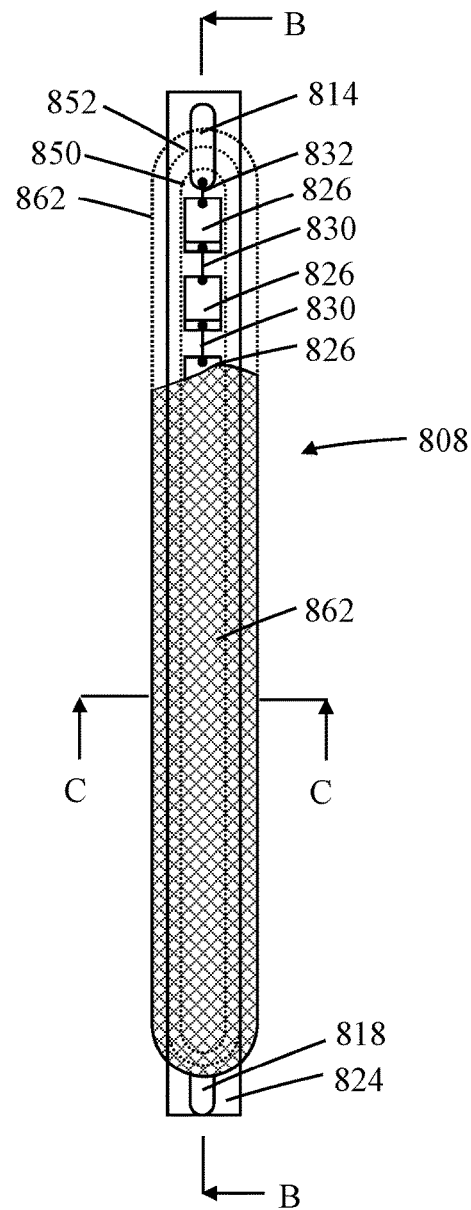
SECTION B-B
FIG. 8A
FIG. 8B

SECTION C-C

LED-FILAMENT COMPRISING A LIGHT SCATTERING MATERIAL LAYER

CROSS REFERENCE TO RELATED APPLICATIONS

This application is a continuation of U.S. patent application Ser. No. 17/543,639, filed Dec. 6, 2021, and issued on Oct. 10, 2023 as U.S. Pat. No. 11,781,714; which in turn is a continuation-in-part of U.S. patent application Ser. No. 16/540,019, filed Aug. 13, 2019, and issued on May 24, 2022 as U.S. Pat. No. 11,342,311; which in turn claims the benefit of priority to (1) U.S. provisional patent application No. 62/820,249, filed Mar. 18, 2019, and (2) U.S. provisional patent application No. 62/831,699, filed Apr. 9, 2019, each of which is hereby incorporated by reference in its entirety.

FIELD OF THE INVENTION

Embodiments of the present invention are directed to LED-filaments and LED-filament lamps. More particularly, although not exclusively, the invention concerns LED-filaments and LED-filament lamps that generate light having a General Color Rendering Index (CRI) Ra of at least 80.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lm/W and higher), white LEDs are rapidly being used to replace conventional fluorescent, compact fluorescent and incandescent lamps.

Recently, LED-filament lamps have been developed comprising LED-filaments whose visual appearance resemble the filament of a traditional incandescent lamp. The LED-filaments, which are typically about 2 inches (52 mm) long, comprise COG (Chip-On-Glass) devices having a plurality of low-power LED chips mounted on one face of a light-transmissive glass/ceramic substrate. Front and back faces of the light-transmissive substrate are coated with a phosphor-impregnated encapsulant, such as silicone. Typically, the phosphor comprises a mixture of green and red light emitting phosphors for generating warm white light and to increase General Color Rendering Index (CRI Ra) of light generated by the filament. The same phosphor-impregnated encapsulant is applied to both faces of the substrate to ensure that the filament generates the same color of light in forward and backward directions.

Narrowband red phosphors such as, for example, manganese-activated fluoride phosphors such as $K_2SiF_6:Mn^{4+}$ (KSF), $K_2TiF_6:Mn^{4+}$ (KTF), and $K_2GeF_6:Mn^{4+}$ (KGF) have a very narrow red spectrum (Full Width at Half Maximum of less than 10 nm for their main emission line spectrum) which makes them highly desirable for attaining high brightness (about 25% brighter than broadband red phosphors such as europium-activated red nitride phosphor materials such as CASN—$CaAlSiN_3:Eu$) and high CRI Ra in general lighting applications. While manganese-activated fluoride photoluminescence materials are highly desirable, there are drawbacks that make their use in LED-filaments challenging. For example, the absorption capability of manganese-activated fluoride phosphors is substantially lower (typically about a tenth) than that of europium-activated red nitride phosphor materials which are currently used in LED-filaments. Therefore, in order to achieve the same target color point, the usage amount of manganese-activated fluoride phosphors typically can be from 5 to 20 times greater than the usage amount of a corresponding europium-activated red nitride phosphor. The increased amount of phosphor usage significantly increases the cost of manufacture since manganese-activated fluoride phosphors are significantly more expensive than europium-activated red nitride phosphors (at least five times more expensive). Moreover, compared with packaged LEDs, since equal amounts of phosphor are required on each side of the filament, this doubles the usage amount of manganese-activated fluoride photoluminescence material. As a result of the higher usage and higher cost, use of narrowband manganese-activated fluoride red phosphors is prohibitively expensive for LED-filaments.

Embodiments of the invention concern improvements relating to LED-filaments and LED-filament lamps and, in particular, although not exclusively, reducing the cost of manufacture of LED-filaments without compromising on brightness and CRI Ra through innovative phosphor packaging structures to improve the blue absorption efficiency of manganese-activated fluoride photoluminescence material.

One significant undesirable characteristic of LED-filaments is the visual appearance of the LED-filament in an "off-state" which is typically yellow to orange in color. During the "on-state" (i.e. when electrical power is applied to the LED-filament) of the LED-filament, the LED chips (dies) generate blue light and the photoluminescence material(s) (typically phosphor(s)) absorbs a proportion of the blue light and typically re-emits yellow to green and orange to red light. The portion of the blue light generated by the LED chips that is not absorbed by the phosphor combined with the light converted by the phosphor provides light which appears to the human eye as being nearly white in color. However, for an LED-filament in its "off-state", the absence of the blue light, that would otherwise be produced by the LED dies in the "on-state", causes the LED-filament to have a yellowish, yellow-orange, or orange-color appearance that is highly undesirable to the end user. In an unexcited state, phosphor materials are typically white or off-white in color. For an LED-filament in an "off-state", external sources of light such as daylight excite the phosphor which results in the phosphor generating yellow to orange light and this gives rise to the LED-filament having a yellow to orange appearance. A potential consumer or purchaser of LED-filament lamps seeking a white-appearing light may be deterred from purchasing or may become quite confused by the yellowish, yellow-orange, or orange-color appearance of such LED-filament lamps in the marketplace, since on a store shelf the LED-filament is in its "off-state". This may be off-putting or undesirable to the potential purchasers and hence cause a significant loss of sales to target customers.

Embodiments of the invention also address the non-white color appearance of LED-filaments while in their off-state ("off-state" white appearance).

SUMMARY OF THE INVENTION

Some embodiments of the invention concern LED-filaments that are configured to generate a majority (e.g. at least 70% of the total) of light in a forward direction away from a front face of the substrate on which the LED chips are mounted and a small proportion of light in a backward direction away from the back face of the substrate. More particularly, the substrate and LED chips are configured such that the proportion of total blue excitation light generated by the blue LED chips on (emanates from) the front face side of the substrate is substantially greater (e.g. at least 70% of the total) than on (emanates from) the opposite back face side. Such a configuration enables use of a higher brightness narrowband red phosphor on the front face of the substrate only and a less expensive red phosphor other than a manganese-activated fluoride phosphor ("non-manganese-activated fluoride photoluminescence material" also referred to as a broadband red photoluminescence material) on the back face of the substrate while still providing substantially most of the superior brightness benefit of using narrowband manganese activated fluoride on both faces, but using only half (50% by weight) the quantity of narrowband red photoluminescence material. This is to be contrasted with known LED-filaments which use the same photoluminescence materials on the front and back faces of the substrate to ensure a uniform color emission in forward and backward directions. In accordance with the invention, the LED-filament can be configured in the above way by, for example, using: (i) a partially light-transmissive substrate, (ii) LED chips that generate more light from a top face in a forward/upward direction than in a backward/downward direction from a bottom face (base) towards the substrate, (iii) providing a reflector, or partial reflector, on the base of one or more of the LED chips or a combination thereof. The present invention finds particular utility in LED-filaments that use an at least partially light-transmissive substrate.

In some embodiments, an LED-filament comprises a partially light-transmissive substrate having a plurality of blue LED chips mounted on a front face of the substrate; narrowband red and first broadband green to red photoluminescence materials disposed on and covering the front face of the substrate and the plurality of blue LED chips; and second broadband green to red photoluminescence materials covering the opposite back face of the substrate, there being only a small quantity or no narrowband photoluminescence material present on the back face. The narrowband and broadband red photoluminescence materials typically have different crystal structures—that is the red photoluminescence material covering the front face has a different crystal structure to that of the red photoluminescence material covering the back face. In an embodiment, the narrowband red photoluminescence material comprises a manganese-activated fluoride photoluminescence material (e.g. KSF), and the broadband red photoluminescence material comprises rare-earth activated red photoluminescence material, for example, CASN. In this patent specification "broadband red photoluminescence material" and "non manganese-activated fluoride photoluminescence material" denotes a red photoluminescence material whose crystal structure is other than that of a manganese-activated fluoride red photoluminescence material, such as for example rare-earth-activated red photoluminescence materials including for example a red emitting nitride-based phosphor, a Group IIA/IIB selenide sulfide or silicate-based photoluminescence (phosphor) material.

According to an embodiment, an LED-filament comprises: a partially light-transmissive substrate; a plurality of blue LED chips mounted on a front face of the substrate; first broadband green to red photoluminescence materials and a first narrowband manganese-activated fluoride red photoluminescence material covering the plurality of blue LED chips and the front face of the substrate; and second broadband green to red photoluminescence materials covering the back face of the substrate. The inventors have discovered that by providing the narrowband manganese-activated fluoride red photoluminescence on only the front face of the substrate and a less expensive second broadband photoluminescence material on the back face of the substrate provides substantially the same brightness increase benefit but uses only half (50% by weight) the quantity of manganese-activated fluoride photoluminescence material. In embodiments, the LED-filament can further comprises a second narrowband manganese-activated fluoride red photoluminescence material on the back face of the substrate in an amount that is less than 5 wt % of a total red photoluminescence material content on the back face of the substrate. Embodiments of the invention comprise 0 wt % of the second narrowband manganese-activated fluoride red photoluminescence material on the back face of the substrate In embodiments, the substrate has a transmittance of at least one of: 2% to 70%, 30% to 50% and 10% to 30%. In embodiments, at least one of: at least 70%, at least 80%, and at least 90% of the total blue light generated by the LED chips is on the front face side of the substrate. Since, in embodiments of the invention, the substrate is only partially light-transmissive and/or the LED chips have a reflector covering their base, a greater proportion of the total blue excitation light generated by the blue LED chips will be on (emanates from) the front face side of the substrate than on the back face side of the substrate. It will be appreciated that this is true even when the LED chips generate equal amounts of blue excitation light in forward (i.e. away from the front face of the substrate) and backward (i.e. towards the front face substrate) directions since the substrate will allow passage of only a proportion of blue excitation light to pass and reflect the remainder resulting in greater proportion of blue excitation light on the front face side of the substrate. Due to this difference in the proportion of total blue excitation light on opposite faces of the substrate, it enables use of a less expensive broadband red photoluminescence material (e.g. CASN) on a back face of the substrate, thereby substantially reducing costs while increasing brightness.

The LED-filament can comprise a single-layer structure comprising a layer comprising a mixture of the narrowband red photoluminescence material and the first broadband green to red photoluminescence materials. To further reduce narrowband red photoluminescence material usage, the layer can further comprise particles of a light scattering material such as for example particles of zinc oxide; silicon dioxide; titanium dioxide; magnesium oxide; barium sulfate; aluminum oxide and combinations thereof. A single-layer structure may be more robust and also enhance ease of manufacture due the different photoluminescence materials being comprised in the same layer. This may reduce cost and time of manufacture, and also help eradicate errors during manufacture since there are less steps involved in the creation of the single-layer structure.

Alternatively, in order to further improve the blue absorption efficiency of the narrowband red photoluminescence material, the LED-filament can comprise a double-layer structure in which the narrowband red photoluminescence material is located in a separate layer from the broadband green to red photoluminescence materials with the separate layer being disposed on top of the LED chips in, for example, the form of a conformal coating. In such embodiments, an LED-filament can comprise a first layer comprising the first narrowband red photoluminescence material disposed on the plurality of blue LED chips, and a second layer comprising the first broadband green to red photoluminescence material disposed on the first layer. In embodiments, the first layer can comprise a uniform thickness layer (film) on at least the principle light emitting face of at least one of the LED chips, that is the LED-filament comprises CSP (Chip Scale Packaged) LEDs containing the narrowband red photoluminescence material. The first layer can comprise a uniform thickness layer on all light emitting faces of the LED chips in the form of a conformal coating layer. To further reduce narrowband red photoluminescence material usage, the first layer can further comprise particles of a light scattering material such as for example particles of zinc oxide; silicon dioxide; titanium dioxide; magnesium oxide; barium sulfate; aluminum oxide and combinations thereof. The inventors have discovered that compared with a LED-filament comprising a single-layer structure, a double-layer structure can provide a substantial further reduction, up to 80% by weight reduction, in manganese-activated fluoride red photoluminescence material usage. Compared with known LED-filaments having manganese-activated fluoride red photoluminescence material on both front and back faces a double-layer structure can provide a 90% by weight reduction in manganese-activated fluoride red photoluminescence material usage. By providing the narrowband red photoluminescence material in a respective layer disposed on the plurality of LED chips this increases the concentration of narrowband red photoluminescence material in immediate proximity to LED chips and improves the blue absorption efficiency of the narrowband red photoluminescence material, thereby reducing narrowband red photoluminescence material usage.

In embodiments, where the first broadband green to red photoluminescence materials comprises a first broadband red photoluminescence material, a content ratio of the first broadband red photoluminescence material with respect to the total of the first narrowband red photoluminescence material and the first broadband red photoluminescence material is at least one of: at least 20 wt %; at least 30 wt %; at least 40 wt %; and in a range from about 20 wt % to less than 60 wt %.

The narrowband red photoluminescence material(s) such as a manganese-activated fluoride red photoluminescence material can have a peak emission wavelength ranging from 630 nm to 633 nm and may comprise at least one of: $K_2SiF_6:Mn^{4+}$ (KSF), $K_2GeF_6:Mn^{4+}$ (KGF), and $K_2TiF_6:Mn^{4+}$ (KTF).

At least one of the first broadband green to red photoluminescence material and the second broadband green to red photoluminescence materials can comprise a rare-earth-activated red photoluminescence material. The rare-earth-activated red photoluminescence materials can have a peak emission wavelength ranging from 620 nm to 650 nm and may comprise at least one of a nitride-based phosphor material having a general composition $AAlSiN_3:Eu^{2+}$ where A is at least one of Ca, Sr or Ba; a sulfur-based phosphor material having a general composition $(Ca_{1-x}Sr_x)(Se_{1-y}S_y):Eu^{2+}$ where $0 \leq x \leq 1$ and $0 < y \leq 1$ and a silicate-based phosphor material having a general composition $(Ba_{1-x}Sr_x)_3SiO_5:Eu^{2+}$ where $0 < x \leq 1$.

In embodiments, the first broadband green to red photoluminescence materials comprises a first broadband green photoluminescence material and the second broadband green to red photoluminescence materials comprises a second broadband green photoluminescence material. The first broadband green photoluminescence material can have a peak emission wavelength ranging from 530 nm to 550 nm while the second broadband green photoluminescence material can have a peak emission wavelength ranging from 520 nm to 540 nm. The first and/or second broadband green photoluminescence materials can comprise a cerium-activated garnet phosphor having a general composition $(Lu_{1-x}Y_x)_3(Al_{1-y}Ga_y)_5O_{12}:Ce$ where $0 \leq x \leq 1$ and $0 \leq y \leq 1$.

The partially light-transmissive substrate can comprise a material selected from the group consisting of: alumina, silica, magnesium oxide, sapphire, quartz glass, diamond, silicon oxide and mixtures thereof.

The LED-filament can be operable to generate white light with a correlated color temperature from 2700K to 6500K. The LED-filament can be operable to generate white light with a general color rendering index CRI Ra of at least 80 and optionally at least 90.

According to further embodiments, an LED-filament comprises: a partially light-transmissive substrate; a plurality of blue LED chips mounted on a front face of the substrate; a broadband green photoluminescence material, a broadband red photoluminescence material, and a narrowband manganese-activated fluoride red photoluminescence material covering the plurality of blue LED chips and the front face of the substrate; and wherein a content ratio of the broadband red photoluminescence material with respect to the total of the narrowband red photoluminescence material and broadband red photoluminescence material is at least 20 wt %. In embodiments, a content ratio of the broadband red photoluminescence material with respect to the total of the narrowband manganese-activated fluoride red photoluminescence material and broadband red photoluminescence material is at least one of: at least 30 wt %; and at least 40 wt %.

In embodiments, the LED-filament can comprise a first layer having the narrowband red photoluminescence material disposed on the plurality of blue LED chips; and a second layer having the broadband green photoluminescence material disposed on the first layer; and the broadband red photoluminescence material is in at least one of: the first layer and the second layer.

In further embodiments, LED-filaments can comprise a double-layer structure on the front and back faces of the substrate, a so called "double-sided double-layer" structure. According to embodiments, an LED-filament comprises: a partially light-transmissive substrate; a plurality of blue LED chips mounted on a front face of the substrate; a first photoluminescence layer comprising a first narrowband manganese-activated fluoride red photoluminescence material disposed on the plurality of blue LED chips; a second photoluminescence layer comprising a first broadband green to red photoluminescence materials disposed on the first photoluminescence layer; a third photoluminescence layer comprising a second narrowband manganese-activated fluoride red photoluminescence material disposed on the back face of the substrate; and a fourth photoluminescence layer comprising a second broadband green to red photoluminescence material disposed on the third photoluminescence layer. In embodiments, the first layer can comprise a uniform thickness layer (film) on at least the principle light emitting face of at least one of the LED chips, that is the LED-filament comprises CSP (Chip Scale Packaged) LEDs containing the narrowband red photoluminescence material. The first layer can comprise a uniform thickness layer on all light emitting faces of the LED chips in the form of a conformal coating layer. To reduce narrowband red photoluminescence material usage, at least one of the first photoluminescence layer and the third photoluminescence layer further comprises particles of a light scattering material selected from the group comprising: zinc oxide; silicon dioxide; titanium dioxide; magnesium oxide; barium sulfate; aluminum oxide; and combinations thereof. The inventors have discovered such a double-sided double-layer structure can substantially reduce (as much as 80% by weight for a substrate with a transmittance of 100%) the usage amount of the narrowband red photoluminescence material compared with known LED-filaments comprising narrowband and broadband red photoluminescence materials on front and back faces of the substrate. In such embodiments, the substrate can have a transmittance in a range from 20% to 100%.

According to a further embodiment, an LED-filament comprises: a partially light-transmissive substrate; a plurality of blue LED chips mounted on a front face of the substrate; first broadband green to red photoluminescence materials and a narrowband manganese-activated fluoride red photoluminescence material covering the plurality of blue LED chips and the front face of the substrate; and second broadband green to red photoluminescence materials covering the back face of the substrate, wherein at least 70% of the total blue light generated by the LED chips is on the front face side of the substrate.

According to an aspect of the invention, an LED-filament lamp comprises: a light-transmissive envelope; and at least one LED-filament as described herein.

According to another embodiment an LED-filament comprises: a partially light-transmissive substrate; a plurality of LED chips on a front face of the substrate; a first photoluminescence layer comprising a manganese-activated fluoride narrowband red phosphor, wherein the first photoluminescence layer is in direct contact with and covers all of the plurality of LED chips; and a second photoluminescence layer comprising first broadband green and first broadband red phosphors, wherein the second photoluminescence layer is in direct contact with and covers the first photoluminescence layer. The first photoluminescence layer can be in the form of a strip that may be continuous and cover not only all of the LED chips but additionally covers the region of the substrate between LED chips.

In embodiments the LED-filament comprises a third photoluminescence layer on a back face of the substrate comprising second broadband green and second broadband red phosphors. The third photoluminescence layer can contain no manganese-activated fluoride narrowband red phosphor. In other embodiments, the third photoluminescence layer may comprise up to 5 wt % manganese-activated fluoride narrowband red phosphor of a total red photoluminescence material.

In embodiments, the peak emission wavelength of the first broadband red phosphor is different to that of the peak emission wavelength of the second broadband red phosphor. Such an arrangement can be beneficial for generating substantially the same color of light from the front and back faces of the LED-filament especially when there is no, or substantially no, manganese-activated fluoride narrowband red phosphor on the back face of the substrate (third photoluminescence layer). The peak emission wavelength of the first broadband red phosphor on the front face of the filament can be shorter than the peak emission wavelength of the second broadband red phosphor on the back face of the filament. The peak emission wavelength of the first broadband red phosphor can be shorter than the peak emission wavelength of the manganese-activated fluoride narrowband red phosphor. Such an arrangement can be beneficial for increasing the CRI Ra of light generated by the front face of the LED-filament by increasing light intensity for wavelengths between light generated by the first broadband green phosphor and light generated by the manganese-activated fluoride narrowband red phosphor. The peak emission wavelength of the first broadband red phosphor can be from about 610 nm to about 620 nm that is in the orange to red region of the visible spectrum and may be about 615 nm. The peak emission wavelength of the second broadband red phosphor can be longer than the peak emission wavelength of the manganese-activated fluoride narrowband red phosphor and may be from about 630 nm to about 650 nm. The composition of the first broadband red phosphor can be different from the composition of the second broadband red phosphor. For example, the first broadband red phosphor could comprise a CASN phosphor (general composition $CaAlSiN_3$:Eu) while the second broadband red phosphor could comprise a 258 nitride phosphor (general composition $Ba_{2-x}Sr_xSi_5N_8$:Eu).

According to another aspect of the invention, there is contemplated an LED-filament lamp that comprises: an LED-filament comprising: a partially light-transmissive substrate; a plurality of LED chips on a front face of the substrate; a first photoluminescence layer comprising a manganese-activated fluoride narrowband red phosphor, wherein the first photoluminescence layer is in direct contact with and covers all of the plurality of LED chips; and a second photoluminescence layer comprising first broadband green and first broadband red phosphors, wherein the second photoluminescence layer is in direct contact with and covers the first photoluminescence layer.

According to further aspects of the invention, LED-filaments can comprise a light scattering layer comprising particles of a light scattering (refractive or reflective) material that is provided on the exterior surface of the LED-filament and may be in direct contact with and covers the photoluminescence material layer(s). In this patent specification "direct contact" means that there are no air gaps between two adjacent surfaces or layers, such as the light scattering and photoluminescence layer. In embodiments, the light scattering layer can be deposited (fabricated) directly onto the outer photoluminescence layer.

A benefit of the provision of a light scattering layer is that this can substantially reduce the quantity of photoluminescence material required to generate a selected color of emitted light. It is estimated that on average as little as 1 in 10,000 interactions of a photon with a photoluminescence material particle results in absorption and generation of photoluminescence light. The majority, about 99.99%, of interactions of photons with a photoluminescence material particle result in scattering of the photon (without absorption and generation of photoluminescence light). Due to the isotropic nature of the scattering process, on average about half of the photons will be scattered in a direction towards the light scattering layer. Therefore, the light scattering layer increases the probability that a photon will result in the generation of photoluminescence light by scattering light back into the photoluminescence layer where it has a further opportunity to interact with the photoluminescence material. As a result of the increased probability of photons interacting with and exciting the photoluminescence material, the quantity of photoluminescence material required to generate a selected color of light can be reduced. Preliminary tests confirm that the inclusion of a light scattering layer in direct contact with the photoluminescence layer can substantially reduce the quantity of photoluminescence material (in particular manganese-activated fluoride red photoluminescence material) required to generate a given color emission product with only a minimal reduction in intensity of generated light. For example, an LED-filament including a light scattering layer can reduce the use of expensive manganese-activated fluoride red photoluminescence material by up to about 40% with only a 2% reduction in emitted intensity compared with the same LED-filament without a light scattering layer.

Moreover, the provision of a light scattering layer can improve the visual appearance of the LED-filament in the "off-state" ("off-state" white appearance). The light scattering layer scatters (refracts or reflects) light from external sources, for example daylight, which reduces the amount of light reaching the photoluminescence layer and exciting photoluminescence materials therein. Due to the reduction in photoluminescence light generated by the photoluminescence material(s), the color appearance of the filament will be of a color that is close to that of the color of the light scattering material. In embodiments, the particles of light scattering material comprise a material that is white in color (i.e. an achromatic material that reflects or scatters all the visible wavelengths of light) such that in an "off-state" the wavelength conversion component has an appearance that is white in color.

The inventors have discovered that a yet further benefit of the light scattering layer is that this can improve the color uniformity of emitted light such that the LED-filament no longer requires any photoluminescence material on the back face of the substrate. In such arrangements, the light scattering layer can encapsulate the LED-filament and covers both the photoluminescence layer on the front face and back face of the substrate.

Preferably, the photoluminescence layer comprises a mixture of photoluminescence materials and a light transmissive binder, while the light scattering layer comprises a mixture of particles of light scattering material and a light transmissive binder. To minimize optical losses at the interface of the photoluminescence and light scattering layers, the layers can comprise the same light transmissive binder material or binder materials with similar refractive indices. The binder can comprise a curable liquid polymer such as a polymer resin, a monomer resin, an acrylic, an epoxy, a silicone or a fluorinated polymer. The binder can be UV or thermally curable.

The light scattering material may comprise titanium dioxide ($TiO_2$) though it can comprise other materials such as barium sulfate ($BaSO_4$), magnesium oxide ($MgO$), silicon dioxide ($SiO_2$) and/or aluminum oxide ($Al_2O_3$).

In some arrangements, particles of the light scattering material have an average particle size from 1 µm to 50 µm, and more particularly from 10 µm to 20 µm.

In other arrangements, the light scattering material has a particle size that is selected such that the particles will scatter violet to blue light relatively more than they will scatter green to red light generated by the photoluminescence material(s). In such arrangements, the light scattering material particle size can be selected such that the particles will scatter blue light (i.e. excitation light) relatively at least twice as much as they will scatter light generated by the photoluminescence materials. Such a configuration ensures that a higher proportion of the violet to blue light will be scattered and directed by the light scattering layer back into the photoluminescence layer increasing the probability of violet to blues photon interacting with a phosphor material particle and resulting in the generation of photoluminescence light. At the same time, photoluminescence light generated by the photoluminescence materials can pass through the scattering layer with a lower probability of being scattered. Since such a light scattering layer increases the probability of violet to blue photons interacting with photoluminescence material particles, less photoluminescence material can be used to generate a selected emission color of light.

According to an embodiment of the invention, an LED-filament comprises: a partially light transmissive substrate; a plurality of LED chips on a front face of the substrate; a photoluminescence material that is in direct contact with and covers all of the plurality of LED chips; and a light scattering layer that is in direct contact with and covers at least the photoluminescence material, wherein the light scattering layer comprises particles of light scattering material, and wherein the photoluminescence material comprises broadband green to red photoluminescence material and narrowband red photoluminescence material.

The photoluminescence material may comprise a single-layer structure comprising a single-layer comprising the broadband green to red photoluminescence material and the narrowband red photoluminescence material. The photoluminescence materials can be incorporated in a light transmissive binder as a mixture. The single photoluminescence layer can be in the form of a strip that may be continuous and cover not only all of the LED chips but additionally covers the region of the front face of the substrate between LED chips.

In embodiments, the photoluminescence material can comprise a double-layer structure comprising: a first layer comprising the narrowband red photoluminescence material that is in direct contact with and covers each of the plurality of LED chips; and a second layer comprising the broadband green to red photoluminescence material that is in direct contact with and covers the first layer, and wherein the light scattering layer is in direct contact with and covers the second layer. The first layer can be in the form of a strip that may be continuous and cover not only all of the LED chips but additionally covers the region of the front face of the substrate between LED chips.

In embodiments, the light scattering layer can further cover the back face of the substrate.

The LED-filament may comprise further photoluminescence material that is in direct contact with and at least partially covers the back face of the substrate, wherein the further photoluminescence material comprises broadband green to red photoluminescence materials. In such embodiments, the light scattering layer can be in direct contact with and cover the further photoluminescence material.

The light scattering material can be white in color. In embodiments, the LED-filament appears white in color in an off-state thereby improving the visual appearance of the LED-filament in an off-state. The light scattering material can comprise particles of titanium dioxide ($TiO_2$). In embodiments, the light scattering may comprise particles of: zinc oxide ($ZnO$), barium sulfate ($BaSO_4$), magnesium oxide ($MgO$), silicon dioxide ($SiO_2$), aluminum oxide ($Al_2O_3$), zirconium dioxide ($ZrO_2$) or mixtures thereof.

The light scattering layer can comprise a mixture of particles of the light scattering material and a light transmissive binder, and wherein a weight loading of light scattering material to light transmissive binder is from 0.2 wt % to 5 wt %.

The content ratio of broadband red photoluminescence material with respect to the total of the narrowband red photoluminescence material and broadband red photoluminescence material may be from about 0.1 wt % to about 0.5 wt %.

The LED-filament can have a luminous efficacy of at least 180 lm/W.

In embodiments, the narrowband red photoluminescence material can comprise a manganese-activated fluoride narrowband red phosphor such as: $K_2SiF_6:Mn^{4+}$, $K_2GeF_6:Mn^{4+}$, and/or $K_2TiF_6:Mn^{4+}$.

According to another aspect of the invention, there is contemplated an LED-filament lamp that comprises: an LED-filament comprising: a partially light transmissive substrate; a plurality of LED chips on a front face of the substrate; a photoluminescence material that is in direct contact with and covers all of the plurality of LED chips; and a light scattering layer that is in direct contact with and covers at least the photoluminescence material, wherein the light scattering layer comprises particles of light scattering material, and the photoluminescence material comprises broadband green to red photoluminescence materials and narrowband red photoluminescence material and wherein, in an off-state, the LED-filament appears white in color.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, in which:

FIGS. 2A, 2B and 2C respectively illustrate schematic cross-sectional B-B side, partial cutaway plan, and cross-sectional C-C end views of a single-layer LED-filament in accordance with an embodiment of the invention for use in the lamp of FIGS. 1A and 1B;

FIGS. 7A to 7C respectively illustrate schematic cross-sectional B-B side, partial cutaway plan, and cross-sectional C-C end views of a single-layer LED-filament including a light scattering layer in accordance with an embodiment of the invention;

FIGS. 8A to 8C respectively illustrate schematic cross-sectional B-B side, partial cutaway plan, and cross-sectional C-C end views of a double-layer LED-filament including a light scattering layer in accordance with an embodiment of the invention.

DETAILED DESCRIPTION OF THE INVENTION

Figure 1A:
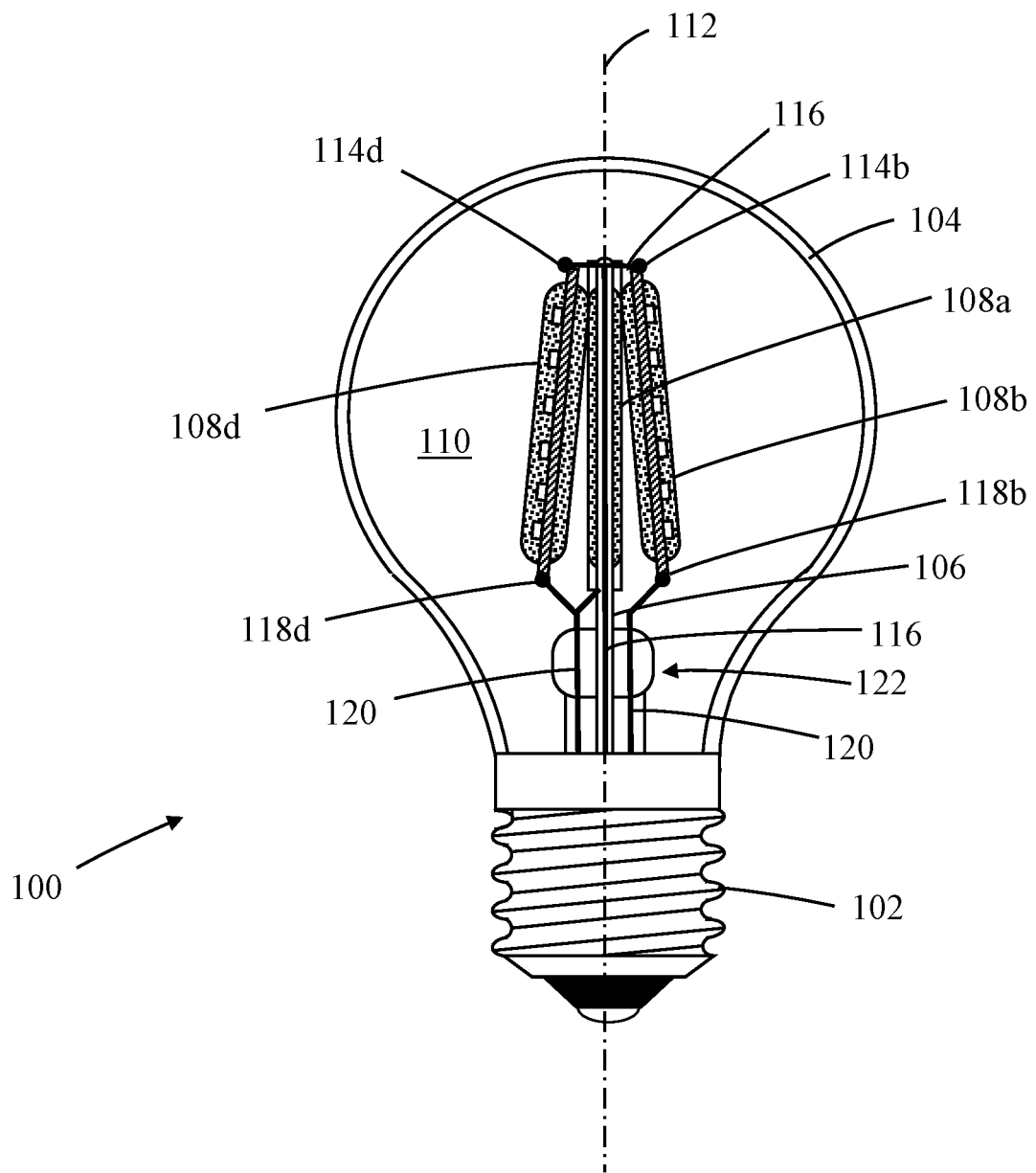
FIGS. 1A and 1B respectively illustrate partial cross-sectional A-A side and plan views of a four LED-filament A-Series (A19) lamp in accordance with an embodiment of the invention.
Figure 1B:
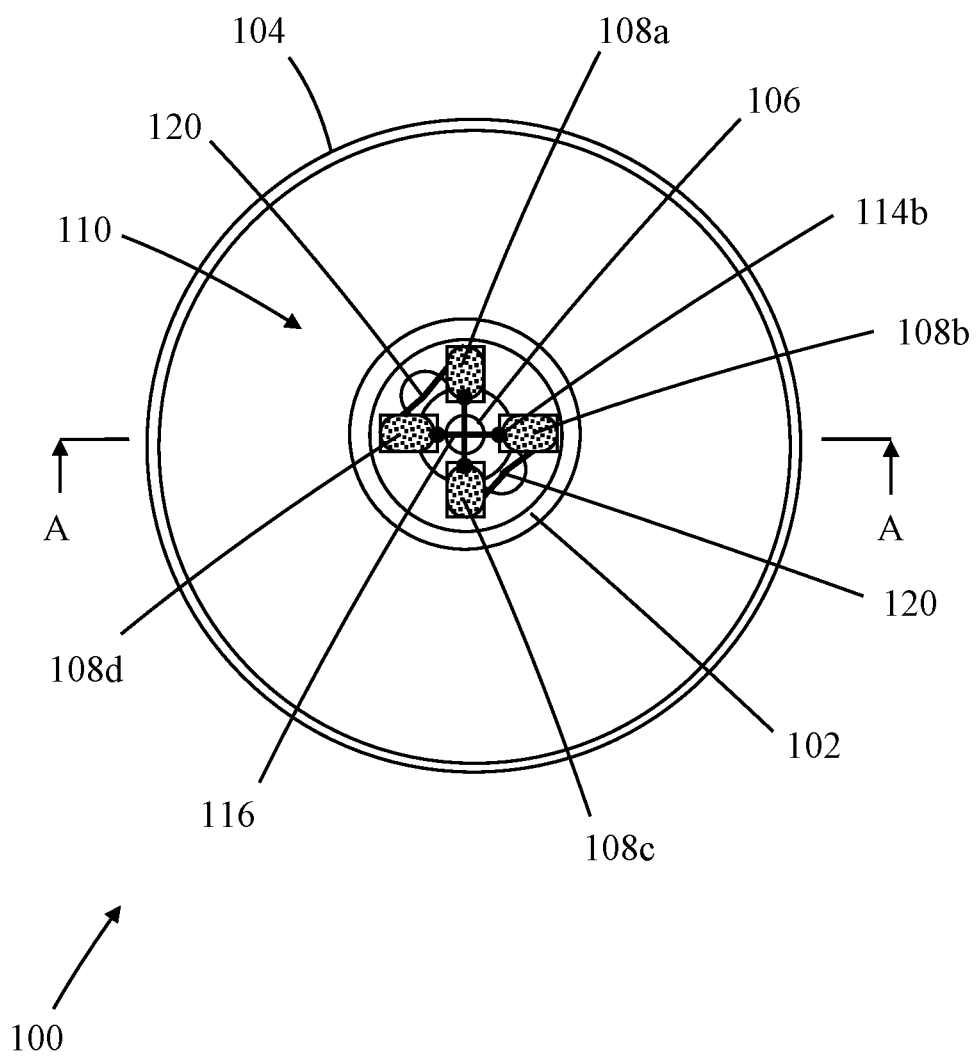

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. FIGS. 1A and 1B respectively illustrate a partial cross-sectional side view through A-A and a partial cutaway plan view of an LED-filament A-Series lamp (bulb) 100 formed in accordance with an embodiment of the invention. The LED-filament lamp (bulb) 100 is intended to be an energy efficient replacement for a traditional incandescent A19 light bulb and can be configured to generate 550 lm of light with a CCT (Correlated Color Temperature) of 2700 K and a general color rendering index CRI Ra of at least 80. The LED-filament lamp is nominally rated at 4 W. As is known, an A-series lamp is the most common lamp type and an A19 lamp is 2⅜ inches (19⁄8 inches) wide at its widest point and approximately 4⅜ inches in length.

The LED-filament lamp 100 comprises a connector base 102, a light-transmissive envelope 104; an LED-filament support 106 and four LED-filaments 108a, 108b, 108c, 108d.

In some embodiments, the LED-filament lamp 100 can be configured for operation with a 110V (r.m.s.) AC (60 Hz) mains power supply as used in North America. For example and as illustrated, the LED-filament lamp 100 can comprise an E26 (φ26 mm) connector base (Edison screw lamp base) 102 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 102 can house rectifier or other driver circuitry (not shown) for operating the LED-filament lamp.

The light-transmissive envelope 104 is attached to the connector 102. The light-transmissive envelope 104 and LED-filament support 106 can comprise glass. The envelope 104 defines a hermetically sealed volume 110 in which the LED-filaments 108a to 108d are located. The envelope 104 can additionally incorporate or include a layer of a light diffusive (scattering) material such as for example particles of zinc oxide (ZnO), titanium dioxide (TiO$_2$), barium sulfate (BaSO$_4$), magnesium oxide (MgO), silicon dioxide (SiO$_2$) or aluminum oxide (Al$_2$O$_3$).

The LED-filaments 108a to 108d, which are linear (strip or elongate) in form, are oriented such that their direction of elongation is generally parallel to an axis 112 of the lamp 100. In this embodiment, the LED-filaments 108a to 108d are equally circumferentially spaced around the glass filament support 106 (FIG. 1B), although it will be appreciated that in other embodiments the LED-filaments may not be equally spaced around the glass support. A first electrical contact 114a to 114d on a first end of each LED-filament 108a to 108d distal to the connector base 102 is electrically and mechanically connected to a first conducting wire 116 that passes down an axis of the LED-filament support 106 to the connector base 102. A second electrical contact 118a to 118d on a second end of each LED-filament 108a to 108d proximal to the connector base 102 is electrically and mechanically connected to a second conducting wire 120 that passes through a base portion 122 of the LED-filament support 106 to the connector base 102. As illustrated, the LED-filaments 108a to 108d can be electrically connected in parallel.

An LED-filament according to an embodiment of the invention is now described with reference to FIGS. 2A, 2B and 2C which respectively show a cross-sectional side view through B-B, a partial cut-away plan and a cross-sectional C-C end view of a single-layer LED-filament 208. Throughout this specification, like reference numerals preceded by the figure number are used to denote like parts. The LED-filament 208 comprises a partially light-transmissive substrate 224 having an array of blue emitting (465 nm) unpackaged LED chips (dies) 226 mounted directly to a front (first) face 228. Typically each LED-filament has a total nominal power of about 0.7 to 1 W.

The substrate 224 can further comprise the respective electrical contacts 214, 218 on the front face 228 at the first and second ends of the substrate 224 for electrical connection to a respective one of the conducting wires 116, 120 (FIG. 1A) to provide electrical power to operate the LED-filament. The electrical contacts 214, 218 can comprise copper, silver or other metal or a transparent electrical conductor such as indium tin oxide (ITO). In the embodiment, illustrated the substrate 224 is planar and has an elongate form (strip) with the LED chips 226 being configured as a linear array (string) and equally spaced along the length (direction of elongation) of the substrate. As indicated in FIGS. 2A and 2B the LED chips 226 can be electrically connected in series by bond wires 230 between adjacent the LED chips of the string and wire bonds 232 between the LED chips at the distal ends of the substrate and their respective electrical contact 214, 218.

When the LED-filament 208 is used as a part of an energy efficient bulb an elongate configuration is typically preferred since the appearance and emission characteristics of the device more closely resembles a traditional filament of an incandescent bulb. It should be noted that the LED chips 226 are unpackaged and emit light from both their top and bottom (base) faces with the base surface of the LED chip mounted directly on the substrate 224.

In accordance the invention, the light-transmissive substrate 224 can comprise any material which is partially light-transmissive and preferably has a transmittance to visible light from 2% to 70% (reflectance of 98% to 30%). The substrate can comprise a glass, ceramic material or a plastics material such as polypropylene, silicone or an acrylic. Typically, in embodiments the light-transmissive substrate comprises a porous ceramic substrate composed of alumina that has a transmittance of about 40%. To aid in the dissipation of heat generated by the LED chips 226, the substrate 224 can not only be light-transmissive, but can also be thermally conductive to aid in the dissipation of heat generated by the LED chips. Examples of suitable light-transmissive thermally conductive materials include: magnesium oxide, sapphire, aluminum oxide, quartz glass, and diamond. The transmittance of the thermally conductive substrate can be increased by making the substrate thin. To increase mechanical strength, the substrate can comprise a laminated structure with the thermally conductive layer mounted on a light-transmissive support such as a glass or plastics material. To further assist in the dissipation of heat, the volume 110 (FIG. 1A) within the glass envelope 104 (FIG. 1A) is preferably filled with a thermally conductive gas such as helium, hydrogen or a mixture thereof.

In accordance with embodiments of the invention, the LED-filament 208 further comprises a first photoluminescence wavelength conversion material 236 applied to and covering the LED chips 226 and front face 228 of the substrate 224 and a second different photoluminescence wavelength conversion material 238 applied to and covering the second back (opposite) face 234 of the substrate 224. The first photoluminescence wavelength conversion material 236 is applied directly to the LEDs chips 226 and covers the front face of the substrate in the form of an encapsulating layer.

In accordance with the invention, the first photoluminescence wavelength conversion material 236 comprises a mixture of a first broadband green photoluminescence material having a peak emission wavelength ranging from 520 nm to 560 nm (preferably 540 nm to 545 nm), a first broadband red photoluminescence material having a peak emission wavelength ranging from 620 nm to 650 nm and a narrowband red photoluminescence material typically a manganese-activated fluoride phosphor. Collectively, the first broadband green and red photoluminescence materials will be referred to as first broadband green to red photoluminescence materials. Since in this embodiment both the narrowband red and broadband green to red photoluminescence materials are provided as a mixture in a single layer, the LED-filament will be referred to as a "single-layer" structured filament.

The second photoluminescence wavelength conversion material 238 comprises a mixture of only a second broadband green photoluminescence material having a peak emission wavelength ranging from 520 nm to 560 nm (preferably 520 nm to 540 nm) and a second broadband red (non-manganese-activated fluoride) photoluminescence material having a peak emission wavelength ranging from 620 nm to 650 nm. Collectively, the second broadband green and red photoluminescence materials will be referred to as second broadband green to red photoluminescence materials.

In contrast, in known LED-filaments, the same photoluminescence material composition (narrowband and broadband red photoluminescence materials) is provided on the front and back faces of the filament. Suitable broadband green photoluminescence materials, narrowband red photoluminescence materials and broadband red photoluminescence materials are discussed below.

In the embodiment illustrated in FIGS. 2A and 2B, the first and second photoluminescence conversion materials 236 and 238 are constituted as a single layer comprising a mixture of broadband green and red photoluminescence materials.

In operation, blue excitation light generated by the LED chips 210 excites the green-emitting and red emitting photoluminescence materials to generate green and red light. The emission product of the LED-filament 208 which appears white in color comprises the combined photoluminescence light and unconverted blue LED light. Since the photoluminescence light generation process is isotropic, phosphor light is generated equally in all directions and light emitted in a direction towards the substrate 224 can pass through the substrate and be emitted from the back of the LED-Filament 208. It will be appreciated that the use of a partially light-transmissive substrate 224 enables the LED-filament to achieve an emission characteristic in which light is emitted in a direction away from both the front face 228 and back face 234 of the substrate. Additionally, particles of a light scattering material can be combined with the phosphor material to reduce the quantity of phosphor required to generate a given emission product color.

Figure 3A:
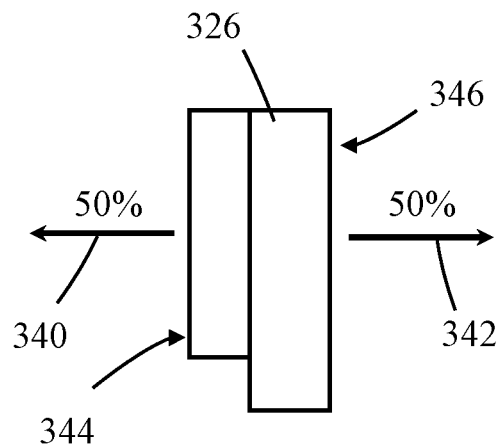
FIGS. 3A and 3B are respectively a schematic representation of an LED chip showing its emission characteristics in forward and backward directions and a schematic exploded representation of an LED chip and substrate indicating the distribution of blue excitation light present at front and back face sides of the substrate.
Figure 3B:
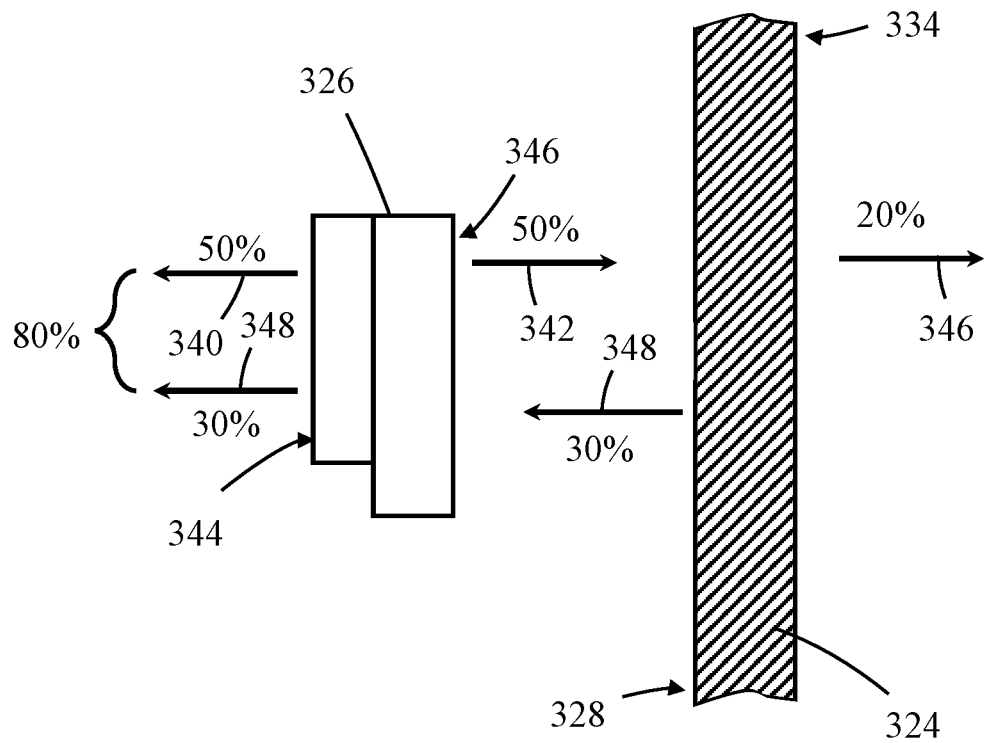

FIG. 3A is a schematic representation of an LED chip 326 showing its emission characteristics in forward/upward 340 and backward/downward 342 directions and FIG. 3B is a schematic exploded representation of the LED chip 326 and a partially light-transmissive substrate 324 indicating the distribution of blue excitation light on opposite face sides 328 and 334 of the substrate 324.

Referring to FIG. 3A and assuming that the blue LED chip 326 emits equal amounts of blue light from its top surface 344 and its base 346, then 50% of the total blue light generated by the LED chip is emitted in a forward direction 340 away from the front face of the substrate and 50% of the total blue light generated by the LED chip is emitted in a backward direction 342 towards the front face of the substrate. Referring to FIG. 3B and assuming that the partially light-transmissive substrate 324 has a transmittance of 40% and a reflectance of 60%, only 40% of the blue light 342 (i.e. 20% of the total blue light generated by the blue LED chip 346) will pass through the substrate 324 and emanate 346 from the back face side 334 of the substrate 324. The remaining 60% of blue light 342 (i.e. 30% of the total blue light generated by the blue LED chip) will be reflected by the substrate 324 in a forward direction and emanate from the front face side 328 of the substrate. It will appreciated that the net effect is that approximately 80% of the total blue light generated by the blue LED chip 348 will be on (emanates from) the front face side of the substrate and only 20% of the total blue light generated by the blue LED chip 348 will be on (emanates from) the back face side of the substrate. Clearly, when the photoluminescence materials are present these figures may change due to scattering of blue light by the photoluminescence materials. As described above, by configuring the proportion of total blue excitation light generated by the blue LED chips present at the front face side of the substrate to be substantially greater (typically at least 70% of the total) than at the opposite back face side this enables use of the higher brightness manganese-activated fluoride phosphor on the front face of the substrate only and a less expensive non manganese-activated fluoride phosphor on the back face of the substrate while still providing substantially most of the increase in brightness benefit but using only half (50% by weight) the quantity of manganese-activated fluoride photoluminescence material. TABLE 1 tabulates the effect of substrate transmittance/reflectance on the proportion of total blue excitation light on (emanates from) the front face and back face sides of the substrate and the relative overall brightness of the LED-filament. The data assumes that each blue LED chip generates equal amounts of blue excitation light in forward and backward directions. The overall relative brightness is relative to a known LED-filament having CASN on the front and back faces of the substrate. For comparison, the relative brightness for an LED-filament having KSF on both faces of the substrate is 120% though it will be appreciated that uses twice the amount of KSF than the LED-filaments of the invention.

TABLE 1

Effect of substrate transmittance/reflectance on the proportion of blue excitation light on the front and back face sides of the substrate and LED-filament brightness

| Substrate | | % of total blue excitation light on: | | LED-Filament |
| --- | --- | --- | --- | --- |
| Transmittance (%) | Reflectance (%) | Front face side of substrate | Back face side of substrate | Brightness (%) |
| 5 | 95 | 97.5 | 2.5 | 124.4 |
| 10 | 90 | 95.0 | 5.0 | 123.8 |
| 20 | 80 | 90.0 | 10.0 | 122.5 |
| 40 | 60 | 80.0 | 20.0 | 120.0 |
| 50 | 50 | 75.0 | 25.0 | 118.8 |
| 60 | 40 | 70.0 | 30.0 | 117.5 |
| 70 | 30 | 65.0 | 35.0 | 116.3 |

Figure 4A:
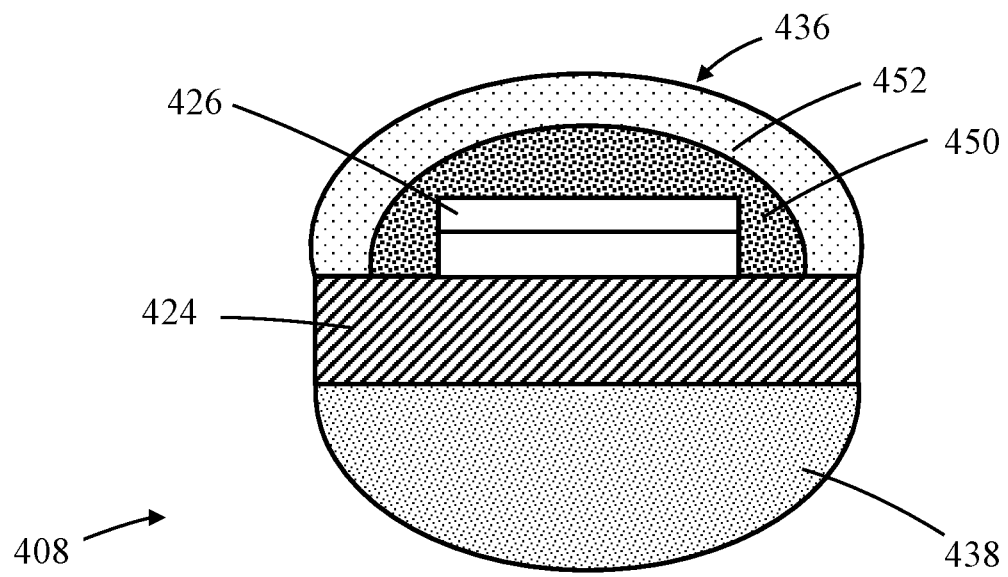
FIGS. 4A and 4B are schematic cross-sectional end views of double-layer LED-filaments in accordance with embodiments of the invention.
Figure 4B:
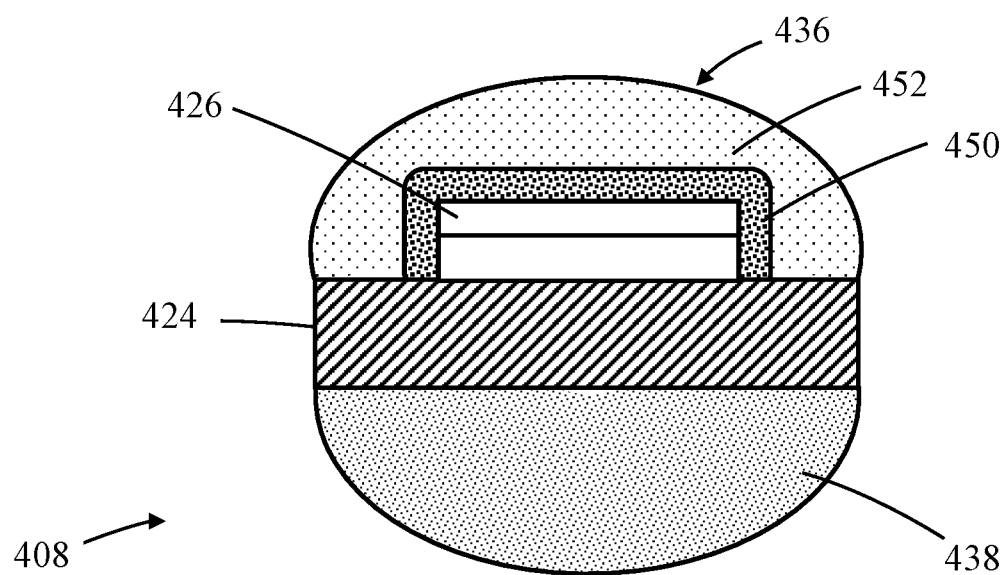

FIGS. 4A and 4B are schematic cross-sectional end views of double-layer LED-filaments 408 in accordance with embodiments of the invention. In these embodiments, the first photoluminescence wavelength conversion material 436 covering the LED chips comprises a "double-layer" structure comprising first and second photoluminescence layers 450 and 452 that respectively contain narrowband red and first broadband green to red photoluminescence materials. As illustrated in FIGS. 4A and 4B, the first photoluminescence layer 450, containing the narrowband red photoluminescence material, is disposed on and covers the LED chips 426 and the second photoluminescence layer 452, containing the first broadband green to red photoluminescence materials (that is first broadband green and first broadband red photoluminescence materials), is disposed on and covers the first photoluminescence layer 450 (that is the first photoluminescence layer 450 is in closer proximity to the LED chips than the second photoluminescence layer).

The double-layer LED-filament of FIG. 4A can be manufactured by firstly depositing the first photoluminescence layer 450 onto the LED chips 426 and then depositing the second photoluminescence layer 452 on the first photoluminescence layer 450. As illustrated the first photoluminescence layer 450 can have a cross section that is generally semi-circular in profile.

In the double-layer LED-filament of FIG. 4B the first photoluminescence layer 450 comprises a uniform thickness coating layer that is applied to the light emitting faces of individual LED chips. LED chips with a uniform thickness layer (film) of phosphor on their light emitting faces are often referred to as CSP (Chip Scale Packaged) LEDs. As illustrated in FIG. 4B the LED chip 426 has a uniform thickness layer applied to the top light emitting and four side light emitting faces and is in the form of a conformal coating. In embodiments (not shown) the LED chip 426 has a uniform thickness first photoluminescence layer 450 applied to the principle (top) light emitting face only. The double-layer LED-filament can be manufactured by first applying the first photoluminescence layer 450 to at least the principle light emitting face of individual LED chips 426, for example using a uniform thickness (typically 20 µm to 300 µm) photoluminescence film comprising the narrowband red photoluminescence material. The LED chips 426 are then mounted on the substrate 424 and the second photoluminescence layer 452 then deposited to cover the substrate and LED chips. Compared with the double-layer LED-filament of FIG. 4A a uniform thickness coating layer can be preferred as it concentrates all of the narrowband red photoluminescence material as close to the LED chip as possible and ensures that, regardless of physical location within the layer, all of the narrowband red photoluminescence material receives exposure to substantially the same excitation light photon density. Such an arrangement can maximize the reduction in narrowband red photoluminescence material usage.

Figure 2C:
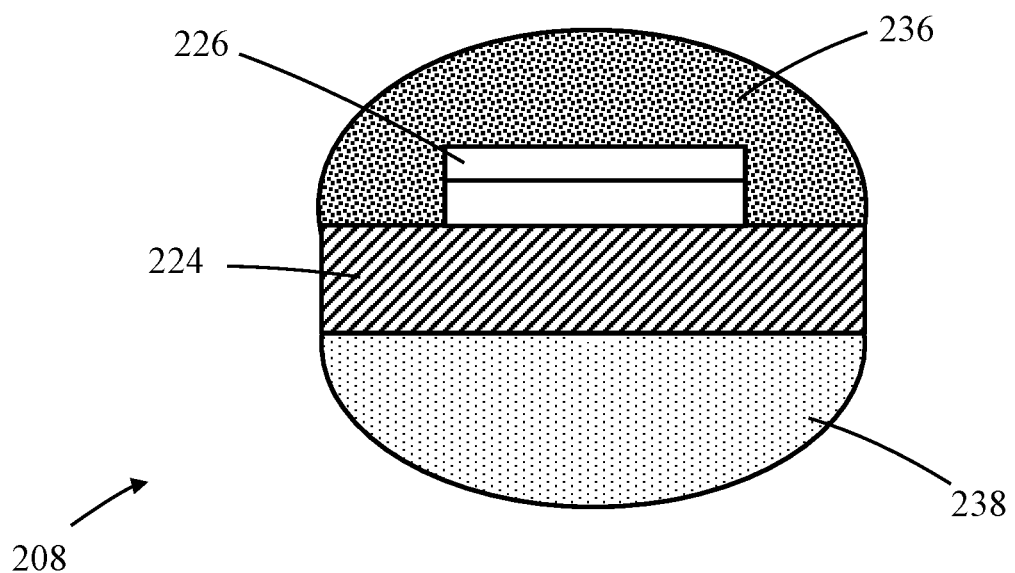

The inventors have discovered that providing the narrowband red photoluminescence material as a respective individual layer 450 (double-layer structure) is found to further substantially reduce (up to a further 80% by weight reduction) the usage amount of the narrowband red photoluminescence material compared with an LED-filament in which the narrowband red and broadband green photoluminescence materials comprise a mixture in a single layer (FIG. 2C). Moreover, compared with a known LED-filament in which narrowband red photoluminescence material is provided on both faces of the substrate, a double-layer structured LED-filament reduces the usage amount of narrowband red photoluminescence material by as much as 90% by weight.

It is believed that the reason for this reduction in usage amount, is that in an LED-filament (FIG. 2C) in which the photoluminescence material 236 comprises a single photoluminescence layer comprising a mixture of a narrowband red photoluminescence material and broadband green to red photoluminescence materials, the photoluminescence materials have equal exposure to blue excitation light. Since narrowband red photoluminescence materials, especially manganese-activated fluoride photoluminescence materials, have a much lower blue light absorption capability than the broadband green photoluminescence materials a greater amount of narrowband red photoluminescence material is necessary to convert enough blue light to the required red emission. By contrast, in the LED-filaments 408 of FIGS. 4A and 4B, the narrowband red photoluminescence material in its separate respective layer 450 is exposed to blue excitation light individually; thus, more of the blue excitation light can be absorbed by the narrowband red photoluminescence material and the remaining blue excitation light can penetrate through to the second photoluminescence layer 452 containing the broadband green to red photoluminescence materials. Advantageously, in this structure the narrowband red photoluminescence material can more effectively convert the blue excitation light to red emission without competition from the green to red photoluminescence materials. Therefore, the amount (usage) of a narrowband red photoluminescence material required to achieve a target color point can be reduced compared with LED-filaments comprising a single-layer comprising a mixture of photoluminescence materials.

Figure 5A:
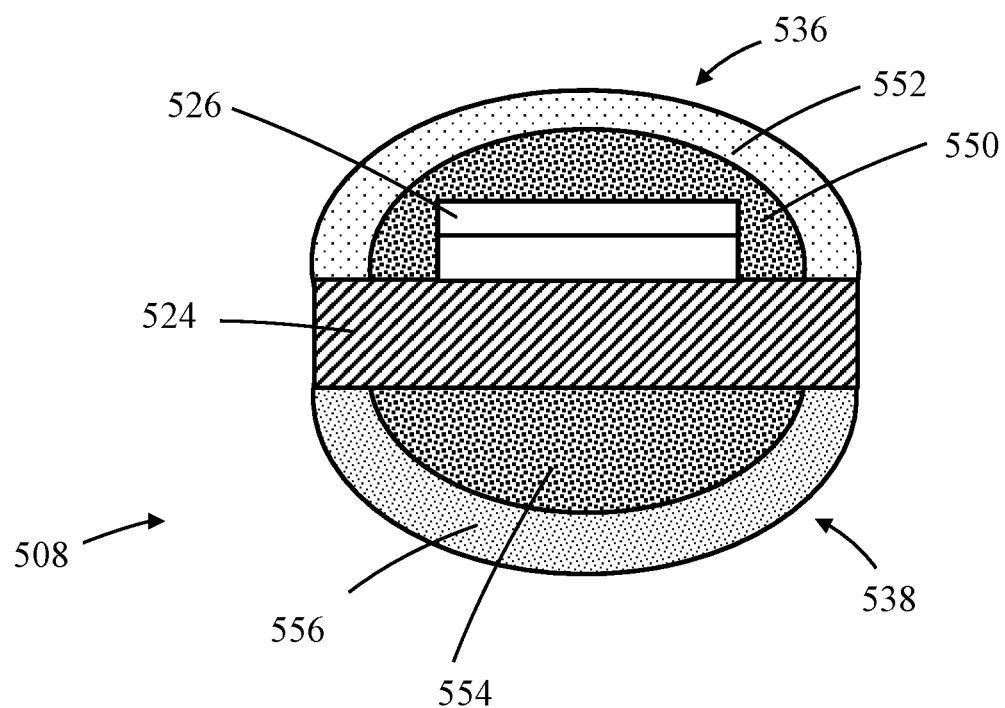
FIGS. 5A and 5B are schematic cross-sectional end views of double-sided double-layer LED-filaments in accordance with embodiments of the invention.
Figure 5B:
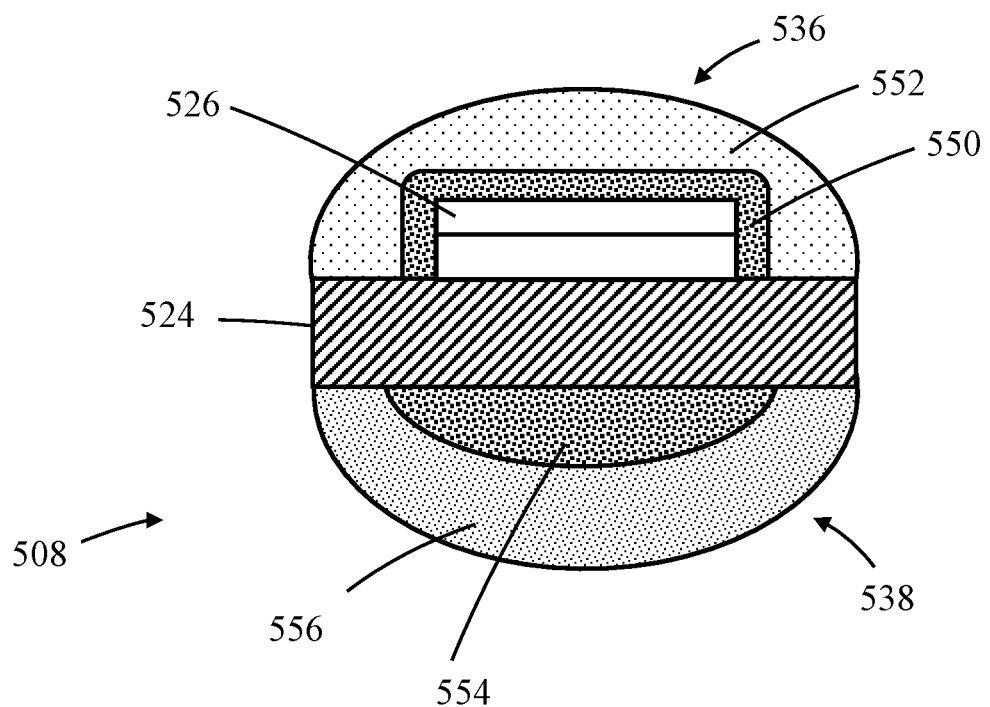

FIGS. 5A and 5B are schematic cross-sectional end views of a double-sided double-layer LED-filaments in accordance with embodiments of the invention. In these embodiments, both the first 536 and second 538 photoluminescence wavelength conversion materials covering the front and back face of the substrate comprise a "double-layer" structure. On the front face of the substrate, the first photoluminescence material 536 covering the LED chips comprises first and second photoluminescence layers 550 and 552 that respectively contain first narrowband red and first broadband green to red photoluminescence materials. As illustrated, the first photoluminescence layer 550, containing the first narrowband red photoluminescence material, is disposed on and covers the LED chips 526 and the second photoluminescence layer 552, containing the first broadband green to red photoluminescence materials, is disposed on and covers the first photoluminescence layer 550 (that is the first photoluminescence layer 550 is in closer proximity to the LED chips than the second photoluminescence layer). On the back face of the substrate, the second photoluminescence material 538 covering the back face of the substrate 524 comprises third and fourth photoluminescence layers 554 and 556 that respectively contain second narrowband red and second broadband green to red photoluminescence materials. As illustrated, the third photoluminescence layer 554, containing the second narrowband red photoluminescence material, is disposed on and cover a part of the substrate corresponding with the LED chips 526 and the fourth photoluminescence layer 556, containing the second broadband green to red photoluminescence materials, is disposed on and covers the third photoluminescence layer 554 (that is the third photoluminescence layer 554 is in closer proximity to the back face of the substrate than the fourth photoluminescence layer).

The double-layer double-sided LED-filament of FIG. 5A can be manufactured by firstly depositing the first photoluminescence layer 550 onto the LED chips 526 and then depositing the second photoluminescence layer 552 on the first photoluminescence layer 550. As illustrated the first photoluminescence layer 550 can have a cross section that is generally semi-circular in profile. The third photoluminescence layer 554 is deposited on the back face of the substrate corresponding with the LED chips 526, for example as a strip, and the fourth photoluminescence layer 556 then deposited on and covers the third photoluminescence layer 554. As illustrated the third photoluminescence layer 554 can have a cross section that is generally semi-circular in profile.

In the double-layer double-sided LED-filament of FIG. 5B the first photoluminescence layer 550 comprises a uniform thickness layer applied to at least the principle light emitting face of individual LED chips, that is the LED-filament comprises CSP LEDs. As illustrated in FIG. 5B the LED chip 526 has a uniform thickness layer applied to the top light emitting and four side light emitting faces and is in the form of a conformal coating. In embodiments (not shown) the LED chip 526 has a uniform thickness first photoluminescence layer 550 applied to the principle (top) light emitting face only. The double-layer LED-filament can be manufactured by first applying the first photoluminescence layer 550 to at least the principle light emitting face of individual LED chips 526, for example using a uniform thickness (typically 20 μm to 300 μm) photoluminescence film comprising the narrowband red photoluminescence material. The LED chips 526 are then mounted on the substrate 524 and the second photoluminescence layer 552 then deposited to cover the substrate and LED chips. The third photoluminescence layer 554 is deposited of the back face of the substrate corresponding with the LED chips 526, for example as a strip, and the fourth photoluminescence layer 556 then deposited on, and covers, the third photoluminescence layer 554.

The inventors have discovered LED-filaments having a double-sided double-layer structure can substantially reduce (as much as 80% by weight reduction for a substrate with a transmittance of 100%) the usage amount of the narrowband red photoluminescence material compared with known LED-filaments comprising narrowband and broadband red photoluminescence materials on front and back faces.

Figure 6:
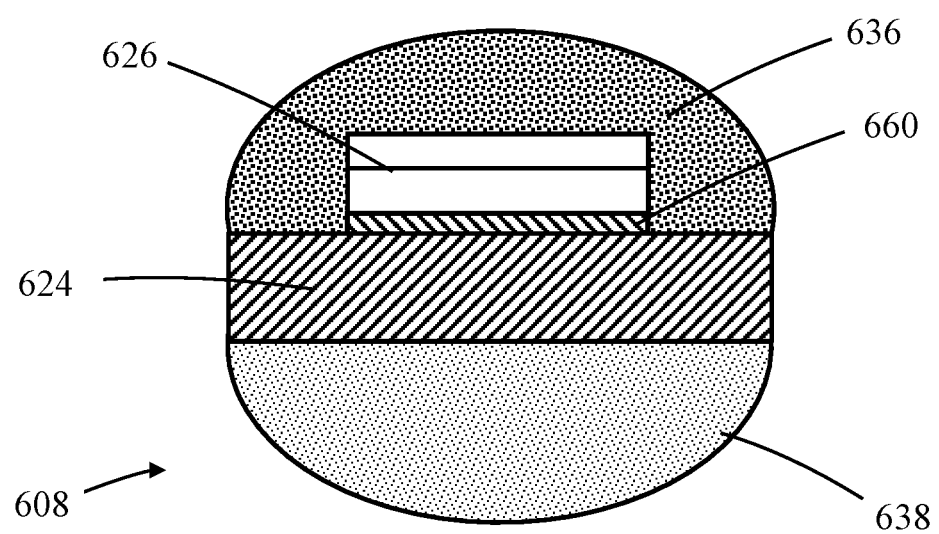
FIG. 6 is a schematic cross-sectional end view of an LED-filament in accordance with an embodiment of the invention.

FIG. 6 is a schematic cross-sectional end view of an LED-filament 608 in accordance with an embodiment of the invention. In this embodiment, the first photoluminescence wavelength conversion material 636 covering the LED chips comprises a "single-layer" structure comprising first broadband green to red photoluminescence materials. The second photoluminescence wavelength conversion material 638 covering the back face of the substrate comprises a "single-layer" structure comprising second broadband green to red photoluminescence materials. In this embodiment, one or more of the LED chips 626 has a reflector 660 on its base. The reflector 660 reduces blue light emission from the base of the LED chip 626 and reflects such light in a forward/upward direction. The reflector can be 100% light reflective or partially light reflective. It will be appreciated that the invention contemplates that other embodiments disclosed herein may also include reflector(s) on the base(s) of the LED chips.

In various embodiments of the invention, and to reduce photoluminescence material usage, in particular to further reduce narrowband red photoluminescence material usage, the LED-filament can further comprise particles of a light scattering material such as for example particles of zinc oxide (ZnO), titanium dioxide (TiO$_2$) barium sulfate (BaSO$_4$), magnesium oxide (MgO), silicon dioxide (SiO$_2$), aluminum oxide (Al$_2$O$_3$), zirconium dioxide (ZrO$_2$) or mixtures thereof. The particles of light scattering material can be provided as a mixture with any of the photoluminescence materials and/or in a separate layer in contact with a photoluminescence material layer. Preferably, the particles of light scattering material are incorporated with the narrowband red photoluminescence material to further reduce narrowband red photoluminescence material usage. For example, for a single-layer structured LED-filament the particles of light scattering material can be incorporated in the first photoluminescence wavelength conversion material 236 as part of the mixture of the first broadband green to red photoluminescence materials and the narrowband red photoluminescence material (FIG. 2C). For a double-layer structured LED-filament, the particles of light scattering material can be incorporated as a mixture with the narrowband red photoluminescence material in the first photoluminescence layer 450 (FIG. 4). For a double-sided double-layer LED-filament, the particles of light scattering material can be incorporated as a mixture with the narrowband red photoluminescence material in the first and/or third photoluminescence layers 550, 554 (FIG. 5).

Alternatively and/or in addition, the particles of light scattering material can be provided in a separate layer that is in contact with a photoluminescence layer such as for example a layer containing the narrowband red photoluminescence material to further reduce narrowband red photoluminescence usage.

The inclusion of particles of a light scattering material with the photoluminescence material increases the number of collisions of LED generated excitation light with particles of the photoluminescence material enhancing photoluminescence light generation which decreases the amount of photoluminescence material usage. It is believed that on average as little as 1 in 10,000 interactions of a photon with a photoluminescence material results in absorption and generation of photoluminescence light. The majority, about 99.99%, of interactions of photons with a photoluminescence material particle result in scattering of the photon. Since the inclusion of the light scattering materials increases the number of collisions this increases the probability of photoluminescence light generation, which decreases the amount of photoluminescence material usage to generate a selected emission intensity/color.

Figure 7C:
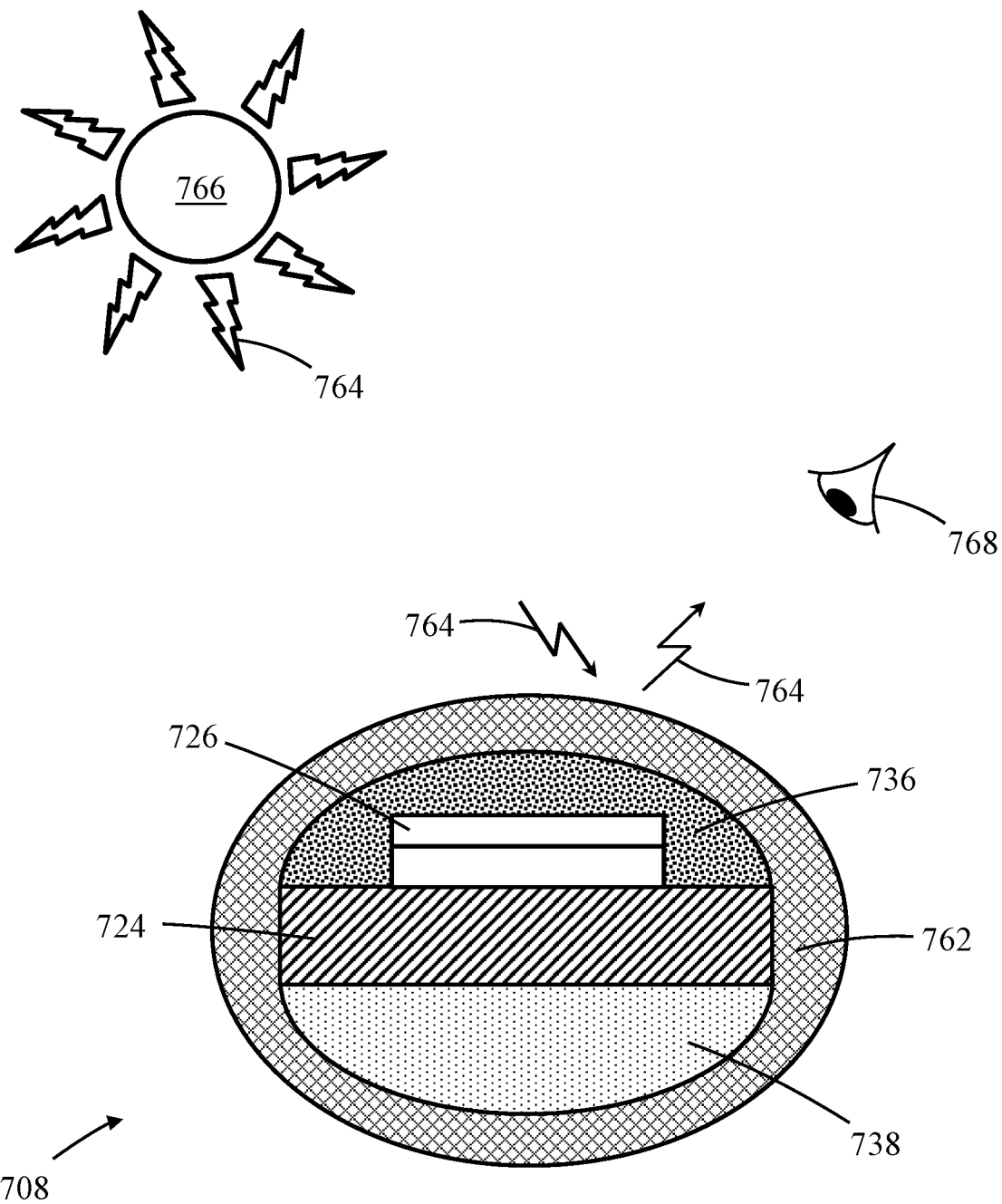

FIGS. 7A to 7C respectively illustrate schematic cross-sectional B-B side, partial cutaway plan, and cross-sectional C-C end views of a single-layer LED-filament 708 including a light scattering layer in accordance with an embodiment of the invention. In this embodiment, the first photoluminescence wavelength conversion material 736 on the front face of the substrate and covering LED chips is constituted as a single layer ("single-layer structure) that comprises a mixture of a first narrowband red photoluminescence material, a first broadband green photoluminescence material and a first broadband red photoluminescence material. Collectively, the first broadband green and red photoluminescence materials will be referred to as first broadband green to red photoluminescence materials. The first photoluminescence wavelength conversion material 736 is applied directly to the LEDs chips 726 and can, as illustrated, cover the front face 728 of the substrate 724 in the form of an encapsulating layer. The first photoluminescence wavelength conversion material 736 can comprise a mixture of particles of photoluminescence material and a light transmissive binder material.

As shown in FIGS. 7A and 7C, the second photoluminescence wavelength conversion material 738 covering the back face 734 of the substrate 724 is constituted as a single layer ("single-layer" structure) that comprises a mixture of a second broadband green photoluminescence material and a second broadband red photoluminescence material. Collectively, the second broadband green and red photoluminescence materials will be referred to as second broadband green to red photoluminescence materials. The second photoluminescence conversion material 738 may further comprise a second narrowband red photoluminescence material. In embodiments, the first and second photoluminescence wavelength conversion materials 736, 738 may comprise the same materials. The second photoluminescence wavelength conversion material 738 can comprise a mixture of particles of photoluminescence material and a light transmissive binder material.

As shown in FIG. 7C, a light scattering material layer 762 is provided in direct contact with and covers the first and second photoluminescence wavelength conversion materials 736, 738. The light scattering material layer 762 can, as illustrated, fully encapsulate the LED-filament 708. The light scattering material layer 762 comprises a mixture of particles of light scattering material and a light transmissive binder. To minimize optical losses at the interface between the light scattering material layer 762 and the first and second photoluminescence wavelength conversion materials 736, 738, it is advantageous if the layers comprise the same light transmissive binder material or binder materials with similar refractive indices. The light transmissive binder can comprise a curable liquid polymer such as a polymer resin, a monomer resin, an acrylic, an epoxy, a silicone or a fluorinated polymer. The binder can be UV or thermally curable. The loading of light scattering material to light transmissive binder can be from about 0.1 wt % to about 5.0 wt %. As shown in FIG. 7C, and for ease of fabrication, the light scattering material layer 762 may comprise a single continuous layer that fully encapsulates the LED-filament 708. In other embodiments, the light scattering material layer 762 may comprise a respective light scattering material layer on the front 728 and back face 734 of the LED-filament 708. In such an arrangement, the wt % loading of light scattering material to light transmissive binder for the front face 728 can be different from the back face 734 of the filament.

The light scattering material may comprise particles of titanium dioxide ($TiO_2$), though it can comprise other materials such as barium sulfate ($BaSO_4$), magnesium oxide (MgO), silicon dioxide ($SiO_2$) or aluminum oxide ($Al_2O_3$). In some arrangements, particles of the light scattering material have an average particle size from 1 μm to 50 μm and more preferably from 10 μm to 20 μm. In other arrangements, the light scattering material has a particle size that is selected such that the particles will scatter blue light relatively more than they will scatter green to red light generated by the photoluminescence material(s). In such arrangements, the light scattering material particle size can be selected such that the particles will Rayleigh scatter blue light at least twice as much as they will scatter light generated by the photoluminescence materials. Such a configuration ensures that a higher proportion of blue light will be scattered by the light scattering material layer 762 in a direction back towards and into the first and second photoluminescence wavelength conversion materials 736, 738 thereby increasing the probability of blue photons interacting with a photoluminescence material particles and resulting in the generation of photoluminescence light. At the same time, photoluminescence light generated by the photoluminescence materials can pass through the light scattering material layer with a lower probability of being scattered compared with the blue light. Since the light scattering material layer 762 increases the probability of blue photons interacting with photoluminescence material particles, less photoluminescence material can be used to generate a selected emission color of light.

The use of a separate light scattering material layer 762 that covers (encapsulates), or at least substantially covers, the photoluminescence wavelength conversion material layers 736, 738 can substantially reduce the quantity of photoluminescence materials required to generate a selected color of emitted light. As described herein, it is estimated that on average as little as 1 in 10,000 interactions of a photon with a photoluminescence material particle results in absorption and generation of photoluminescence light. The majority, about 99.99%, of interactions of photons with a photoluminescence material particle result in scattering of the photon (without absorption and generation of photoluminescence light). Due to the isotropic nature of the scattering process on average about half of the photons will be scattered in a direction towards the light scattering material layer. It is believed that the light scattering material layer 762 increases the probability that a photon will result in the generation of photoluminescence light by scattering light back towards and into the photoluminescence wavelength conversion material layers 736, 738 where it can interact the photoluminescence material. As a result of the increased probability of photons interacting with and exciting the photoluminescence material, the quantity of photoluminescence material required to generate a selected color of light can be reduced. Tests indicate that inclusion of a light scattering material layer in direct contact with the photoluminescence layer can substantially reduce the quantity of photoluminescence material (in particular narrowband red photoluminescence material) required to generate a given color emission product with only a minimal reduction in intensity of generated light. For example, a single-layer LED-filament in accordance with the invention that comprises a light scattering material layer this can reduce the use of manganese-activated fluoride red photoluminescence material by up to about 35% and overall phosphor usage by up to about 35% with only a 2% reduction in emitted intensity/luminous efficacy compared with the same single-layer LED-filament without a light scattering material layer.

A further benefit of a separate light scattering material layer 762 that at least substantially encapsulates the LED-filament, is that it can improve the visual appearance, "white appearance", of the LED-filament 708 in the "off-state" ("off-state" white appearance). The light scattering material layer will scatter light 764 originating from external sources 766, for example daylight, which reduces the amount of light reaching the underlying photoluminescence material layers 736, 738 and exciting photoluminescence materials therein. Due to the reduction in photoluminescence light generated by the photoluminescence material(s), the color appearance of the filament 708 to an observer 768 will have a color that more closely resembles the color of the light scattering material (rather than that of the photoluminescence material, for example, which is undesirable). In embodiments, the particles of light scattering material comprise a material that is white in color (i.e. an achromatic material that reflects or scatters all the visible wavelengths of light) such that in an "off-state" the LED-filament 708 has an appearance that is white in color.

Figure 7D:
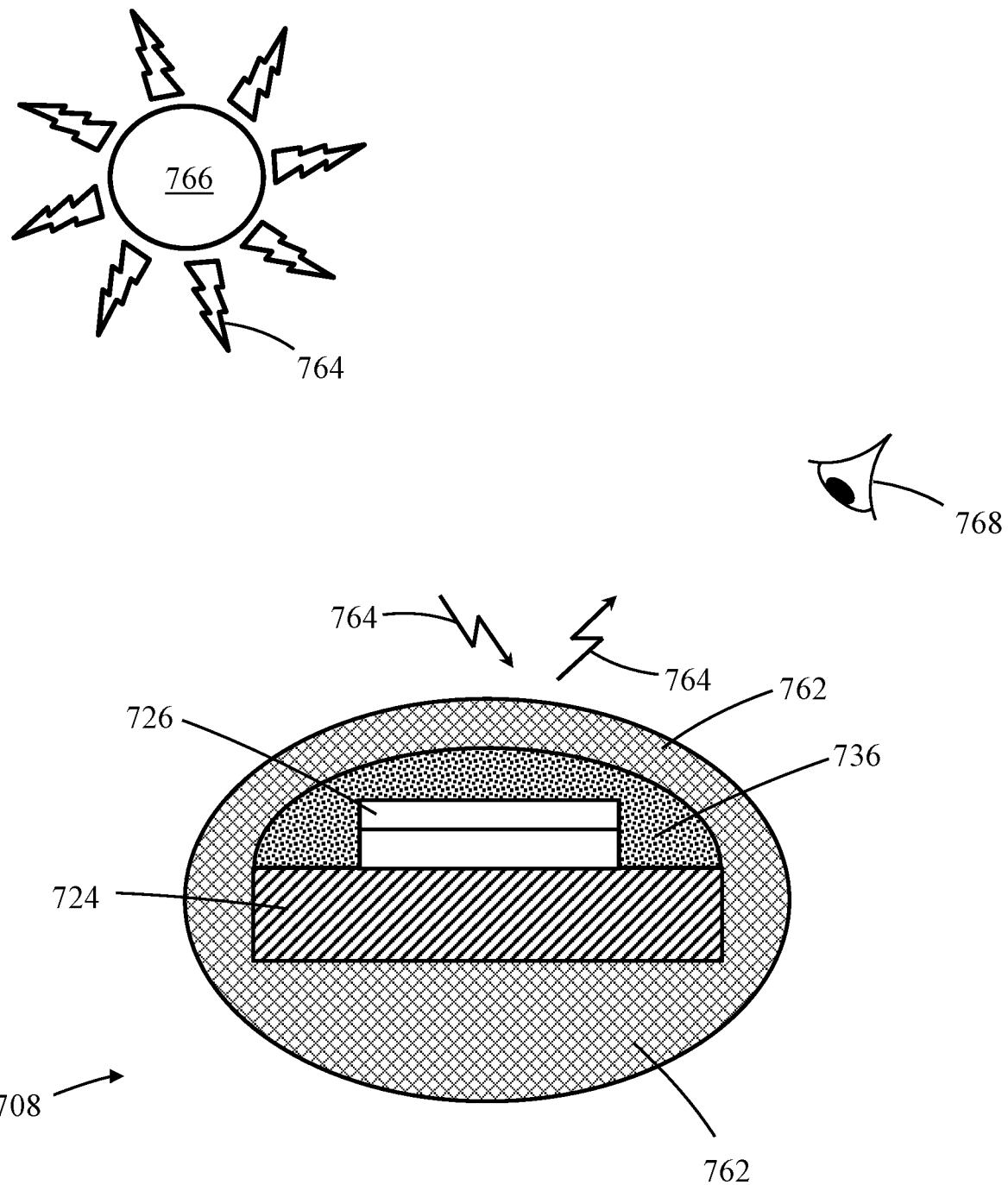
FIG. 7D is a schematic cross-sectional end view of a single-layer LED-filament including a light scattering layer in accordance with an embodiment of the invention.

The inventors have discovered that a yet further benefit of a light scattering layer 762 that at least covers the back face 734 of the LED-filament 708, is that this can improve the color uniformity of emitted light to an extent that the LED-filament 708 no longer requires photoluminescence materials 738 on the back face 734 of the substrate 724, thereby further reducing overall photoluminescence material usage. As shown in FIG. 7D, in such an arrangement, there are no photoluminescence materials on the back face 734 of the substrate 724 and the light scattering material layer 762 is in direct contact with and covers both the first photoluminescence material layer 736 on the front face and the back face 734 of the substrate 724. As indicated in FIG. 7D, and for ease of fabrication, the light scattering material layer 762 may comprise a single continuous layer that fully encapsulates the LED-filament 708. In other embodiments, the light scattering material layer 762 may comprise a respective light scattering material layer on the front and back faces 728, 734 of the filament 708. In such an arrangement, the wt % loading of light scattering material to light transmissive binder can be different for the front and back faces 728, 734 of the filament 708. For example, since the thickness of the light scattering material layer 762 on the back face 734 may be greater than that of the front face 724, the wt % loading on light scattering material to light transmissive binder may be lower on the back face 734 than on the front face 728.

Tests indicate that a single-layer LED-filament in accordance with the invention, that includes a light scattering layer and has no photoluminescence materials on the back face 734, can reduce the use of manganese-activated fluoride red photoluminescence material by up to about 35% and overall phosphor usage by up to about 60% with only a 2% reduction in emitted intensity compared with an single-layer LED-filament without a light scattering material layer (see TABLES 13A, 13B and 14—Dev. 6 compared with Dev. 5).

The single-layer LED-filament 708 of FIGS. 7A to 7C can be manufactured by: depositing the first photoluminescence wavelength conversion material 736 as a layer on the front face of the substrate 728 such that it covers each of the LED chips 726; depositing the second photoluminescence wavelength conversion material 738 as a single layer on the back face 734 of the substrate 724; and then depositing the light scattering material layer 762 as an encapsulating layer in direct contact with and covering the first and second photoluminescence wavelength conversion materials 736, 738. As illustrated in FIG. 7C, the first and second photoluminescence wavelength conversion material layers 736, 738 can have a cross section that is generally semi-circular in profile.

The single-layer LED-filament 708 of FIG. 7D can be manufactured by depositing the first photoluminescence wavelength conversion material 736 as a single layer on a front face of the substrate 724 such that it covers each of the LED chips 726 and then depositing the light scattering material layer 762 as an encapsulating layer in direct contact with and covering the first photoluminescence wavelength conversion material 736 and back face 734 of the substrate 724. As illustrated in FIG. 7D, the first photoluminescence wavelength conversion material layer 736 and light scattering material on the back face 734 of the substrate 724 can have a cross section that is generally semi-circular in profile.

Figure 8C:
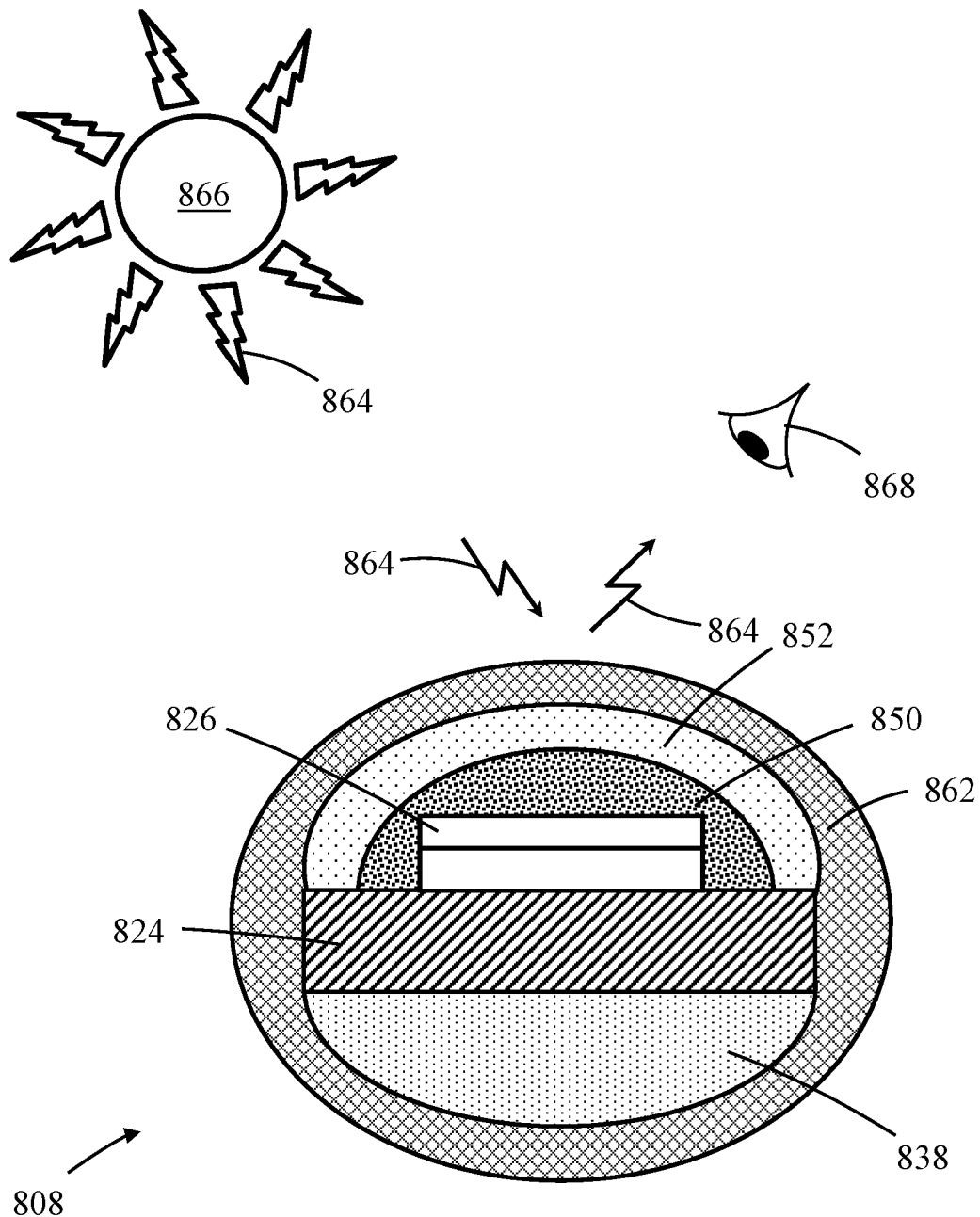

FIGS. 8A to 8C respectively illustrate schematic cross-sectional B-B side, partial cutaway plan, and cross-sectional C-C end views of a double-layer LED-filament 808 including a light scattering layer 862 in accordance with an embodiment of the invention. In this embodiment, the first photoluminescence wavelength conversion material covering the LED chips is constituted by a double layer ("double-layer structure") comprising first and second photoluminescence layers 850 and 852 that respectively comprise narrowband red and first broadband green to red photoluminescence materials.

The first photoluminescence layer 850, comprising the narrowband red photoluminescence material, is disposed on and covers each of the LED chip 826 and front face 828 of the substrate 824 between the LED chips 826 and can be in the form of an encapsulating layer. The first photoluminescence layer 850 can comprise a mixture of particles of narrowband red photoluminescence material and a light transmissive binder material.

The second photoluminescence layer 852, comprising the first broadband green to red photoluminescence materials (that is first broadband green and first broadband red photoluminescence materials), is disposed on and covers the first photoluminescence layer 850 and front face 828 of the substrate 824 not already covered by the first photoluminescence layer 850 (that is the first photoluminescence layer 850 is in closer proximity to the LED chips 826 than the second photoluminescence layer 850). The second photoluminescence layer 852 may be in the form of an encapsulating layer and can comprise a mixture of particles of first broadband green to red photoluminescence materials and a light transmissive binder material.

As described herein, a benefit of a double-layer structure comprising a respective layer (first photoluminescence layer 850) comprising substantially only a narrowband red photoluminescence material compared with a single-layer arrangement is a substantial reduction in the amount of narrowband red photoluminescence material required to a selected color of emitted light. This can provide a substantial cost saving as narrowband red photoluminescence materials are typically many times more expensive than broadband green to red photoluminescence materials.

As shown in FIGS. 8A and 8C, a second photoluminescence wavelength conversion material 838, in the form of a single-layer structure, is provided on and covers the second back (opposite) face 834 of the substrate 824. The second photoluminescence wavelength conversion material 838 comprises a mixture of second broadband green to red photoluminescence materials (that is second broadband green and second broadband red photoluminescence materials). The second photoluminescence conversion material 838 may further comprise a second narrowband red photoluminescence material. In embodiments, the photoluminescence wavelength conversion materials on the front and back faces 828, 834 of the substrate 824 may comprise the same materials. The second photoluminescence wavelength conversion material 838 can comprise a mixture of particles of photoluminescence material and a light transmissive binder material.

As shown in FIG. 8C, a light scattering material layer 862 is provided in direct contact with and covers the second photoluminescence layer 852 and the second photoluminescence wavelength conversion material 838. The light scattering material layer 862 can, as illustrated, fully encapsulate the LED-filament. The light scattering material layer 862 comprises a mixture of particles of light scattering material and a light transmissive binder. To minimize optical losses at the interface between the light scattering material layer 862 and the second photoluminescence layer 852 and the second photoluminescence wavelength conversion material 838, it is advantageous if the layers comprise the same light transmissive binder material or binder materials with similar refractive indices. The light transmissive binder can comprise a curable liquid polymer such as a polymer resin, a monomer resin, an acrylic, an epoxy, a silicone or a fluorinated polymer. The binder can be UV or thermally curable. The loading of light scattering material to light transmissive binder can be from about 0.1 wt % to about 5.0 wt %. As shown in FIG. 8C, and for ease of fabrication, the light scattering material layer 862 may comprise a single continuous layer that fully encapsulates the LED-filament. In other embodiments, the light scattering material layer 862 may comprise a respective light scattering material layer on the front and back face 834 of the filament. In such an arrangement, the wt % loading of light scattering material to light transmissive binder can be different for the front and back faces 828, 834 of the filament.

Figure 8D:
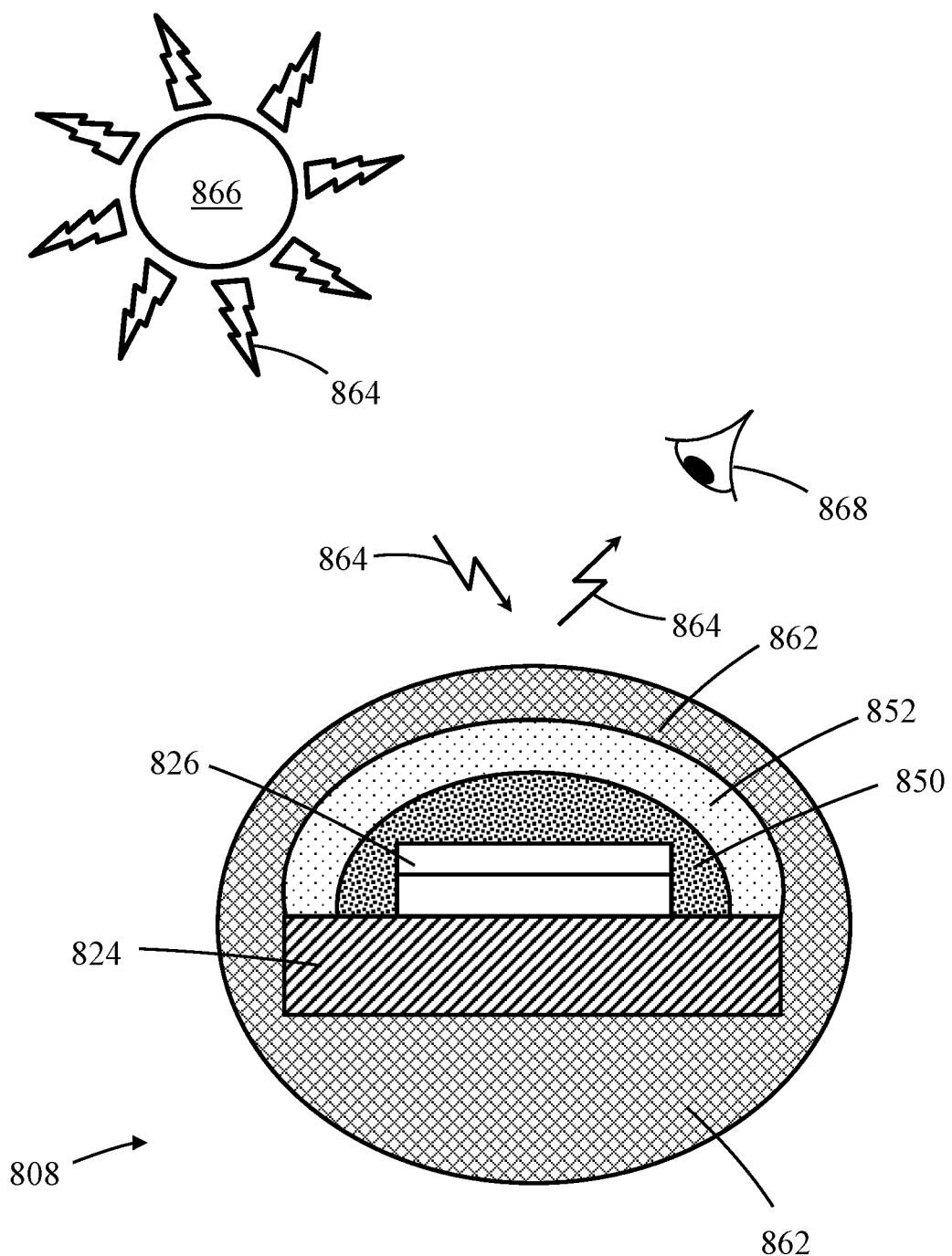
FIG. 8D is a schematic cross-sectional end view of a double-layer LED-filament including a light scattering layer in accordance with an embodiment of the invention.

As described herein, the provision of a separate light scattering material layer 862 that covers (encapsulates), or at least substantially covers, the photoluminescence materials on the front and back faces 828, 834 of the LED-filament, are that it can: (i) substantially reduce the quantity of photoluminescence materials required to generate a selected color of emitted light and (ii) improve the visual appearance, white appearance, of the LED-filament 808 in the "off-state" ("off-state" white appearance). A further benefit of the light scattering layer 862 that covers at least the back face 834 of the LED-filament, is that it can eliminate the need to provide photoluminescence materials 838 on the back face 834 of the substrate 824 thereby further reducing the overall photoluminescence material usage. As shown in FIG. 8D, in such an arrangement, there are no photoluminescence materials on the back face 834 of the substrate 824 and the light scattering material layer 862 is in direct contact with and covers both the second photoluminescence layer 850 on the front face 828 and the back face 834 of the substrate 824. As indicated in FIG. 8D, and for ease of fabrication, the light scattering material layer 862 may comprise a single continuous layer that fully encapsulates the LED-filament. In other embodiments, the light scattering material layer may comprise a respective light scattering material layer on the front and back faces 828, 834 of the filament. In such an arrangement, the wt % loading of light scattering material to light transmissive binder can be different for the front and back faces 828, 834 of the filament 808. For example, since the thickness of the light scattering material layer on the back face 834 may be greater than that of the front face 828, the wt % loading on light scattering material to light transmissive binder may be lower on the back face 834 than on the front face 834.

The double-layer LED-filament 808 of FIGS. 8A to 8C can be manufactured by: depositing the first photoluminescence layer 850 on a front face of the substrate 824 such that it covers the LED chips 826; depositing the second photoluminescence layer 852 as an encapsulating layer in direct contact with and covering the first photoluminescence layer 852; depositing the second photoluminescence wavelength conversion material 838 as a single layer on the back face 834 of the substrate 824; and depositing the light scattering material layer 862 as an encapsulating layer in direct contact with and covering the second photoluminescence layer 852 and second photoluminescence wavelength conversion material layer 838. As illustrated, the first photoluminescence layer 850 and second photoluminescence wavelength conversion material layer 838 can have a cross section that is generally semi-circular in profile. The light scattering material layer 862 can, as illustrated, fully encapsulate the LED-filament 808.

The double-layer LED-filament 808 of FIG. 8D can be manufactured by: depositing the first photoluminescence layer 850 on a front face of the substrate 824 such that it covers the LED chips 826; depositing the second photoluminescence layer 852 as an encapsulating layer in direct contact with and covering the first photoluminescence layer 852; and depositing the light scattering material layer 862 as an encapsulating layer in direct contact with and covering the second photoluminescence layer 852 and back face 834 of the substrate 824. As illustrated, the first photoluminescence layer 850 and portion of light scattering material layer 862 on the back face 834 of the substrate 824 can have a cross section that is generally semi-circular in profile. The light scattering material layer 862 can, as illustrated, fully encapsulate the LED-filament 808.

Broadband Green Photoluminescence Materials

In this patent specification, a broadband green photoluminescence material refers to a material which generates light having a peak emission wavelength ($\lambda_{pe}$) in a range ~520 nm to ~560 nm, that is in the yellow/green to green region of the visible spectrum. Preferably, the green photoluminescence material has a broad emission characteristic and preferably has a FWHM (Full Width Half Maximum) of between about 50 nm and about 120 nm. The green photoluminescence material can comprise any photoluminescence material, such as for example, garnet-based inorganic phosphor materials, silicate phosphor materials and oxynitride phosphor materials. Examples of suitable green phosphors are given in TABLE 2.

In some embodiments, the green photoluminescence materials comprises a cerium-activated yttrium aluminum garnet phosphor of general composition $Y_3(Al_{1-y}Ga_y)_5O_{12}$:Ce (YAG) where $0<y<1$ such as for example a YAG series phosphor from Intematix Corporation, Fremont California, USA which have a peak emission wavelength of in a range 520 nm to 543 nm and a FWHM of ~120 nm. In this patent specification, the notation YAG # represents the phosphor type—YAG-based phosphors—followed by the peak emission wavelength in nanometers (#). For example, YAG535 denotes a YAG phosphor with a peak emission wavelength of 535 nm. The green photoluminescence material may comprise a cerium-activated yttrium aluminum garnet phosphor of general composition $(Y,Ba)_3(Al, Ga)_5O_{12}$:Ce (YAG) such as for example a GNYAG series phosphor from Intematix Corporation, Fremont California, USA. In some embodiments, the green photoluminescence material can comprise an aluminate (LuAG) phosphor of general composition $Lu_3Al_5O_{12}$:Ce (GAL). Examples of such phosphors include for example the GAL series of phosphor from Intematix Corporation, Fremont California, USA which have a peak emission wavelength of 516 nm to 560 nm and a FWHM of ~120 nm. In this patent specification, the notation GAL # represents the phosphor type (GAL)—LuAG-based phosphors—followed by the peak emission wavelength in nanometers (#). For example, GAL520 denotes a GAL phosphor with a peak emission wavelength of 520 nm. Suitable green phosphors are given in TABLE 2.

Examples of green silicate phosphors include europium activated ortho-silicate phosphors of general composition $(Ba, Sr)_2SiO_4$: Eu such as for example G, EG, Y and EY series of phosphors from Intematix Corporation, Fremont California, USA which have a peak emission wavelength in a range 507 nm to 570 nm and a FWHM of ~70 nm to ~80 nm. Suitable green phosphors are given in TABLE 2.

In some embodiments, the green phosphor can comprise a green-emitting oxynitride phosphor as taught in U.S. Pat. No. 8,679,367 entitled "Green Emitting (Oxy) Nitride-Based Phosphors and Light Emitting Devices Using the Same" which is hereby incorporated in its entirety. Such a green-emitting oxynitride (ON) phosphor can have a general composition $Eu^{2+}:M^{2+}Si_4AlO_xN_{(7-2x/3)}$ where $0.1 \leq x \leq 1.0$ and $M^{2+}$ is one or more divalent metal selected from the group consisting of Mg, Ca, Sr, Ba, and Zn. In this patent specification, the notation ON # represents the phosphor type (oxynitride) followed by the peak emission wavelength ($\lambda_{pe}$) in nanometers (#). For example ON495 denotes a green oxynitride phosphor with a peak emission wavelength of 495 nm.

TABLE 2

Example broadband green photoluminescence materials

| Phosphor | General Composition | | Wavelength $\lambda_p$ (nm) |
|---|---|---|---|
| YAG (YAG #) | $Y_{3-x}(Al_{1-y}Ga_y)_5O_{12}:Ce_x$ | $0.01 < x < 0.2$ & $0 < y < 2.5$ | 520-550 |
| GNYAG (YAG #) | $(Y, Ba)_{3-x}(Al_{1-y}Ga_y)_5O_{12}:Ce_x$ | $0.01 < x < 0.2$ & $0 < y < 2.5$ | 520-550 |
| LuAG (GAL #) | $Lu_{3-x}(Al_{1-y}M_y)_5O_{12}:Ce_x$ | $0.01 < x < 0.2$ & $0 < y < 1.5$ M = Mg, Ca, Sr, Ba, Ga, | 500-550 |
| LuAG (GAL #) | $Lu_{3-x}(Al_{1-y}Ga_y)_5O_{12}:Ce_x$ | $0.01 < x < 0.2$ & $0 < y < 1.5$ | 500-550 |
| Silicate | $A_2SiO_4:Eu$ | A = Mg, Ca, Sr, Ba | 500-550 |
| Silicate | $(Sr_{1-x}Ba_x)_2SiO_4:Eu$ | $0.3 < x < 0.9$ | 500-550 |
| Oxynitride (ON #) | $Eu^{2+}:M^{2+}Si_4AlO_xN_{(7-2x/3)}$ | $M^{2+}$ = Mg, Ca, Sr, Ba, Zn $0.1 \leq x \leq 1.0$ | 500-550 |

Red Photoluminescence Materials
Narrowband Red Photoluminescence Materials

In this patent specification, a narrowband red photoluminescence material refers to a photoluminescence material which, in response to stimulation by excitation light, generates light having a peak emission wavelength in a range 610 nm to 655 nm; that is light in the red region of the visible spectrum and which has a narrow emission characteristic with a Full Width at Half Maximum (FWHM) emission intensity of between about 5 nm and about 50 nm (less than about 50 nm). As described above, the narrowband red photoluminescence can comprise a manganese-activated fluoride red photoluminescence material that is disposed on and covers the front face of the substrate on which the LED chips are mounted. An example of a narrowband red manganese-activated fluoride photoluminescence material is manganese-activated potassium hexafluorosilicate phosphor (KSF)—$K_2SiF_6:Mn^{4+}$ (KSF). An example of such a KSF phosphor is NR6931 KSF phosphor from Intematix Corporation, Fremont California, USA which has a peak emission wavelength of about 632 nm. Other manganese-activated phosphors can include: manganese-activated potassium hexafluorogermate phosphor (KGF)—$K_2GeF_6:Mn^{4+}$ and manganese-activated potassium hexafluorotitanate phosphor (KTF)—$K_2TiF_6:Mn^{4+}$.

Broadband Red Photoluminescence Materials

In this patent specification, a broadband red photoluminescence material (also referred to as a non-manganese-activated fluoride red photoluminescence material) refers to a photoluminescence material which, in response to stimulation by excitation light, generates light having a peak emission wavelength in a range 600 nm to 640 nm; that is light in the orange to red region of the visible spectrum and which has a broad emission characteristic with a full width at half maximum (FWHM) emission intensity of greater than about 50 nm. As described above, the broadband red photoluminescence can comprise rare-earth activated red photoluminescence materials. A broadband red photoluminescence material (non-manganese-activated fluoride red photoluminescence material) denotes a red photoluminescence material whose crystal structure is other than that of a narrowband red photoluminescence material (manganese-activated fluoride photoluminescence material), such as for example rare-earth-activated red photoluminescence materials and can comprise any such red photoluminescence material that is excitable by blue light and operable to emit light with a peak emission wavelength $\lambda_p$ in a range about 600 nm to about 640 nm. Rare-earth-activated red photoluminescence material can include, for example, a europium activated silicon nitride-based phosphor, α-SiAlON, Group IIA/IIB selenide sulfide-based phosphor or silicate-based phosphors. Examples of red phosphors are given in TABLE 3.

In some embodiments, the europium activated silicon nitride-based phosphor comprises a Calcium Aluminum Silicon Nitride phosphor (CASN) of general formula $CaAlSiN_3:Eu^{2+}$. The CASN phosphor can be doped with other elements such as strontium (Sr), general formula $(Sr,Ca)AlSiN_3:Eu^{2+}$. In this patent specification, the notation CASN # represents the phosphor type (CASN) followed by the peak emission wavelength ($\lambda_{pe}$) in nanometers (#). For example, CASN625 denotes a red CASN phosphor with a peak emission wavelength of 625 nm.

In an embodiment, the rare-earth-activated red phosphor can comprise a red-emitting phosphor as taught in U.S. Pat. No. 8,597,545 entitled "Red-Emitting Nitride-Based Calcium-Stabilized Phosphors" which is hereby incorporated in its entirety. Such a red emitting phosphor comprises a nitride-based composition represented by the chemical formula $M_aSr_bSi_cAl_dN_eEu_f$, wherein: M is Ca, and $0.1 \leq a \leq 0.4$; $1.5 < b < 2.5$; $4.0 \leq c \leq 5.0$; $0.1 \leq d \leq 0.15$; $7.5 < e < 8.5$; and $0 < f < 0.1$; wherein $a + b + f > 2 + d/v$ and v is the valence of M.

Alternatively, the rare—earth-activated red phosphor can comprise a red emitting nitride-based phosphor as taught in U.S. Pat. No. 8,663,502 entitled "Red-Emitting Nitride-Based Phosphors" which is hereby incorporated in its entirety. Such a red emitting phosphor comprising a nitride-based composition represented by the chemical formula $M_{(x/v)}M'_2Si_{5-x}Al_xN_8:RE$, wherein: M is at least one monovalent, divalent or trivalent metal with valence v; M' is at least one of Mg, Ca, Sr, Ba, and Zn; and RE is at least one of Eu, Ce, Tb, Pr, and Mn; wherein x satisfies $0.1 \leq x < 0.4$, and wherein said red-emitting phosphor has the general crystalline structure of $M'_2Si_5N_8:RE$, Al substitutes for Si within said general crystalline structure, and M is located within said general crystalline structure substantially at the interstitial sites. An example of one such a phosphor is XR610 red nitride phosphor from Intematix Corporation, Fremont California, USA which has a peak emission wavelength of 610 nm.

Rare-earth-activated red phosphors can also include Group IIA/IIB selenide sulfide-based phosphors. A first example of a Group IIA/IM selenide sulfide-based phosphor material has a composition $MSe_{1-x}S_x:Eu$, wherein M is at least one of Mg, Ca, Sr, Ba and Zn and $0 < x < 1.0$. A particular example of this phosphor material is CSS phosphor ($CaSe_{1-x}S_x:Eu$). Details of CSS phosphors are provided in co-pending United States patent application Publication Number US2017/0145309 filed 30 Sep. 2016, which is hereby incorporated by reference in its entirety. The CSS red phosphors described in United States patent publication US2017/0145309 can be used in the present invention. The emission peak wavelength of the CSS phosphor can be tuned from 600 nm to 650 nm by altering the S/Se ratio in the composition and exhibits a narrowband red emission spectrum with FWHM in the range ~48 nm to ~60 nm (longer peak emission wavelength typically has a larger FWHM value). In this patent specification, the notation CSS # represents the phosphor type (CSS) followed by the peak emission wavelength in nanometers (#). For example, CSS615 denotes a CSS phosphor with a peak emission wavelength of 615 nm.

In some embodiments, the rare-earth-activated red phosphor can comprise an orange-emitting silicate-based phosphor as taught in U.S. Pat. No. 7,655,156 entitled "Silicate-Based Orange Phosphors" which is hereby incorporated in its entirety. Such an orange-emitting silicate-based phosphor can have a general composition $(Sr_{1-x}M_x)_yEu_zSiO_5$ where $0<x\leq0.5$, $2.6\leq y\leq3.3$, $0.001\leq z\leq0.5$ and M is one or more divalent metal selected from the group consisting of Ba, Mg, Ca, and Zn. In this patent specification, the notation O # represents the phosphor type (orange silicate) followed by the peak emission wavelength ($\lambda_{pe}$) in nanometers (#). For example, O600 denotes an orange silicate phosphor with a peak emission wavelength of 600 nm.

TABLE 3

Example broadband red photoluminescence materials

| Phosphor | General Composition | | Wavelength $\lambda_p$ (nm) |
|---|---|---|---|
| CASN (CASN #) | $(Ca_{1-x}Sr_x)AlSiN_3$:Eu | $0.5 < x \leq 1$ | 600-650 |
| 258 nitride | $Ba_{2-x}Sr_xSi_5N_8$:Eu | $0 < x < 2$ | 580-650 |
| Group IIA/BB Selenide Sulfide | $MSe_{1-x}S_x$:Eu | M = Mg, Ca, Sr, Ba, Zn $0 < x < 1.0$ | 600-650 |
| (CSS #) CSS (CSS #) | $CaSe_{1-x}S_x$:Eu | $0 < x < 1.0$ | 600-650 |
| Silicate (O #) | $(Sr_{1-x}M_x)_yEu_zSiO_5$ | M = Ba, Mg, Ca, Zn $0 < x \leq 0.5$ $2.6 \leq y \leq 3.3$ $0.001 \leq z \leq 0.5$ | 565-650 |

Nomenclature

In this specification, the following nomenclature is used to denote LED-filaments: Com. # denotes a comparative LED-filament having the same photoluminescence materials on the front and back faces of the substrate and Dev. # denotes an LED-filament (device) in accordance with an embodiment of the invention having a narrowband red (manganese-activated fluoride) photoluminescence material on the front face of the substrate and a broadband red photoluminescence material on a back face of the substrate.

Experimental Data—Single-Layer Structure LED-Filament

Comparative LED-filaments (Com.1 and Com.2) and single-layer LED-filament in accordance with the invention (Dev.1) each comprise a 52 mm by 1.5 mm porous silica substrate with a transmittance ≈40% having twenty four serially connected 1025 (10 mil×25 mil) blue LED chips of dominant wavelength $\lambda_d$=456 nm mounted on a front face. Each LED-filament is a nominal 0.7 W device and is intended to generate white light with a target Correlated Color Temperature (CCT) of 2700K and a target general color rendering index CRI Ra of 90.

The photoluminescence materials (phosphors) used in the test devices are KSF phosphor ($K_2SiF_6$:$Mn^{4+}$) from Intematix Corporation, CASN phosphor ($Ca_{1-x}Sr_xAlSiN_3$: Eu $\lambda_{pe}$≈640 nm), green YAG phosphor (Intematix NYAG4156—$(Y, Ba)_{3-x}(Al_{1-y}Ga_y)_5O_{12}$:$Ce_x$ Peak emission wavelength $\lambda_{pe}$=550 nm) and green LuAG phosphor (Intematix GAL535—$Lu_{3-x}(Al_{1-y}Ga_y)_5O_{12}$:$Ce_x\lambda_{pe}$≈535 nm).

The red and green phosphors were mixed in a phenyl silicone and the mixture dispensed onto the front and back faces of the substrate.

TABLE 4 tabulates phosphor composition of comparative LED-filaments Com.1 and Com.2 and an LED-filament Dev.1 in accordance with the invention.

As can be seen from TABLE 4, in terms of phosphor composition: comparative LED-filament Com.1 comprises the same phosphor composition on the front and back faces of the substrate and comprises a mixture of 7 wt % CASN640 and 93 wt % GAL535. Comparative LED-filament Com.2 comprises the same phosphor composition on the front and back faces of the substrate and comprises a mixture of 60 wt % KSF and 40 wt % YAG550. LED-filament Dev.1, in accordance with the invention, comprises on the front face of the substrate a mixture of 56 wt % KSF, 4 wt % CASN615 and 40 wt % YAG550 and on a back face of the substrate a mixture of 7 wt % CASN and 93 wt % GAL535.

TABLE 4

Phosphor composition of comparative LED-filaments (Com. 1 and Com. 2) and an LED-filament in accordance with the invention (Dev. 1)

| | wt % photoluminescence material | | | | | | | | |
|---|---|---|---|---|---|---|---|---|---|
| | Front face | | | | | Back face | | | |
| Filament | KSF | CASN615 | CASN640 | YAG550 | GAL535 | KSF | CASN640 | YAG550 | GAL535 |
| Com. 1 | — | — | 7 | — | 93 | — | 7 | — | 93 |
| Com. 2 | 60 | — | — | 40 | — | 60 | — | 40 | — |
| Dev. 1 | 56 | 4 | — | 40 | — | — | 7 | — | 93 |

TABLE 5 tabulates the measured optical performance of the LED-filaments Com.1, Com.2 and Dev.1. As can be seen from TABLE 5, the flux generated by Dev.1 is 22.2 lm greater (19% brighter: Brightness—Br) than LED-filament Com.1 that uses CASN on both front and back faces of the substrate. While LED-filament Com.2 generates a flux that is 33.5 lm greater (26% brighter: Brightness—Br) than LED-filament Com.1, this LED-filament uses double the amount of KSF (narrowband red photoluminescence material) as that of Dev.1. It will be appreciated that LED-filament Dev.1 achieves 94% (119/126) of the possible brightness gain of using KSF (narrowband red photoluminescence material) in place of CASN, but using only half (50% by weight) the amount of KSF. This is achieved, at least in part, due to the presence of the partially light transmissive substrate used in Dev.1. The invention thus discloses improvements relating to the LED-filaments and LED-filament lamps and in particular, although not exclusively, reducing the cost of manufacture of LED-filaments without compromising on brightness and CRI Ra.

TABLE 5

Measured optical characteristics of 0.7 W, 2700 K nominal color temperature LED-filaments Com. 1, Com. 2 and Dev. 1

| Filament | Flux (lm) | Br (%) | Light emission (%) Forward | Light emission (%) Backward | CIE x | CIE y | CCT (K) | CRI Ra |
|---|---|---|---|---|---|---|---|---|
| Com. 1 | 115.5 | 100 | 84 | 16 | 0.4245 | 0.3952 | 3070 | 95.6 |
| Com. 2 | 145.8 | 126 | 80 | 20 | 0.4391 | 0.4175 | 3148 | 90.5 |
| Dev. 1 | 137.7 | 119 | 80 | 20 | 0.4821 | 0.4395 | 2624 | 85.0 |

Experimental Data—Double-Layer Structured LED-Filament

As discussed above, double-layer structured LED-filaments (FIGS. 4A and 4B) compared with a single-layer structured LED-filament (FIG. 2C) can provide a substantial reduction in usage amount of narrowband red photoluminescence material. Dev.2 is a single-layer LED-filament in accordance with the invention Dev.2 and Dev.3 is a double-layer LED-filament (FIG. 4A) in accordance with the invention.

Dev.2 and Dev.3 each comprise a 38 mm by 1.5 mm porous silica substrate with a transmittance ≈40% having twenty four serially connected 714 (7 mil×14 mil) blue LED chips of dominant wavelength $\lambda_d$=456 nm mounted on a front face. Each LED-filament is a nominal 150 lm (1 W) device and is intended to generate white light with a target Correlated Color Temperature (CCT) of 2700K and a target general color rendering index CRI Ra of 90. It will be appreciated that three of these LED-filaments can be used to provide a 450 lm LED-filament lamp.

phosphors (Intematix GYAG4156 and GYAG543—(Y, Ba)$_{3-x}$(Al$_{1-y}$Ga$_y$)$_5$O$_{12}$:Ce$_x$ Peak emission wavelength $\lambda_{pe}$=543 nm and 550 nm).

For the single-layer LED-filament Dev.2 the red and green phosphors were mixed in a phenyl silicone and the mixture dispensed onto respective front and back faces of the substrate.

For the two-layer LED-filament Dev.3, the KSF was mixed with a phenyl silicone and the mixture dispensed as a strip (first layer) onto the front face of the substrate covering the LED chips. The green phosphor and CASN was mixed in a phenyl silicone and the mixture dispensed as a second layer on the first layer on the front face of the substrate. On the back face, the green phosphor and CASN was mixed in a phenyl silicone and the mixture dispensed onto the back face of the substrate.

TABLE 6 tabulates phosphor compositions of the single-layer LED-filament Dev.2 and the double-layer LED-filament Dev.3. As can be seen from TABLE 6, in terms of phosphor composition the single-layer LED-filament Dev.2 comprises, on the front face of the substrate, a mixture of 74 wt % KSF, 2.2 wt % CASN615 and 23.8 wt % YAG543 and on a back face of the substrate a mixture of 5 wt % CASN (1.4 wt % CASN631+3.6 wt % CASN650) and 95 wt % YAG550. As can be seen from TABLE 6, in terms of phosphor composition the double-layer LED-filament Dev.3 comprises on the front face of the substrate a first layer comprising KSF only (17.0 wt % of the total phosphor content of the front face) and a second layer comprising a mixture of 7.8 wt % CASN615 and 75.2 wt % YAG543 and on a back face of the substrate a mixture of 5 wt % CASN (1.4 wt % CASN631+3.6 wt % CASN650) and 95 wt % YAG550. Dev.3 comprises on the back face of the substrate a mixture of 5 wt % CASN (1.4 wt % CASN631+3.6 wt % CASN650) and 95 wt % YAG550.

TABLE 6

Phosphor composition of a single-layer (Dev. 2) and double-layer (Dev. 3) LED-filaments

| | wt % photoluminescence material | | | | | |
|---|---|---|---|---|---|---|
| | Front face | | | Back face | | |
| | | | | CASN | | |
| Filament | KSF | CASN615 | YAG543 | CASN631 | CASN650 | YAG550 |
| Dev. 2 | 74.0 | 2.2 | 23.8 | 1.4 | 3.6 | 95.0 |
| Dev. 3 | 17.0 | 7.8 | 75.2 | 1.4 | 3.6 | 95.0 |

The photoluminescence materials (phosphors) used in the test devices are KSF phosphor (K$_2$SiF$_6$:Mn$^{4+}$) from Intematix Corporation, CASN phosphors (Ca$_{1-x}$Sr$_x$AlSiN$_3$:Eu $\lambda_{pe}$≈615 nm, 631 nm and 640 nm), and green YAG TABLES 7A and 7B tabulate the phosphor amounts (usage) of the single-layer LED-filament Dev.2 and the double-layer LED-filament Dev.3. The phosphor weight values (weight) in TABLES 7A and 7B are normalized phosphor weight normalized to the weight of KSF of the single-layer LED-filament Dev.1.

TABLE 7A

Phosphor amount of single-layer (Dev. 2) and double-layer (Dev. 3) LED-filaments weight - phosphor weight normalized to weight of KSF of the single-layer LED-filament Dev. 1

| | Front face - Phosphor amount | | | | | | | | |
|---|---|---|---|---|---|---|---|---|---|
| | KSF | | CASN | | YAG | | Total | | CASN/(CASN + KSF) |
| Filament | weight | % | Weight | % | weight | % | weight | % | (wt %) |
| Dev. 2 | 1.0000 | 100 | 0.0302 | 100 | 0.3219 | 100 | 1.3521 | 100 | 2.9 |
| Dev. 3 | 0.2044 | 20 | 0.0942 | 312 | 0.9070 | 282 | 1.2056 | 89 | 31.5 |

TABLE 7B

Phosphor amount of single-layer (Dev. 2) and double-layer (Dev. 3) LED-filaments weight - phosphor weight normalized to weight of KSF of the single-layer LED-filament Dev. 1

| | Phosphor amount | | | | | | | |
|---|---|---|---|---|---|---|---|---|
| | Back face | | | | | | Total | |
| | CASN | | YAG | | Total | | (Front and Back) | |
| Filament | weight | % | weight | % | weight | % | weight | % |
| Dev. 2 | 0.0524 | 100 | 0.9968 | 100 | 1.0492 | 100 | 2.4013 | 100 |
| Dev. 3 | 0.0963 | 184 | 1.8350 | 184 | 1.9313 | 184 | 3.1369 | 131 |

TABLE 8 tabulates the measured optical performance of the LED-filaments Dev.2 (single-layer) and Dev.3 (double-layer). The data are for a drive current $I_F$=15 mA and drive voltage $V_F$=68.7 V and are after 3 minutes of operation once the filament had reached thermal stability (Hot). As can be seen from TABLE 8, the color point of light generated by the LED-filaments are very similar with the General CRI Ra of the double-layer LED-filament Dev.3 being 93.1 compared with 90.5 of the single-layer LED-filament Dev.2. Moreover, the flux generated by the double-layer LED-filament Dev.3 being 4.7 lm greater (3.0% brighter: Brightness—Br) than the flux generated by the single-layer LED-filament Dev.2. Most significantly, while the two LED-filaments generate very similar light emissions, as can be seen from TABLE 8, compared with the single-layer LED-filament Dev.2, the double-layer LED-filament Dev.3 uses 80% by weight less KSF (0.2044 compared with 1.0000), as can be seen from TABLES 7A and 7B. Although the double-layer LED-filament Dev.3 compared with the single-layer LED-filament Dev.2 uses more CASN (212% by weight increase on front face—0.0942 compared with 0.0302 and 84% by weight increase on back face—0.0963 compared with 0.0524) and YAG (182% by weight increase on front face—0.9070 compared with 0.3219 and 84% by weight increase on back face—1.9313 compared with 1.0492), the double-layer structure still provides a substantial cost saving compared with a single-layer structure due to huge difference in costs of CASN (about a ⅕ of the cost of KSF) and YAG (about 1/100 to 1/150 of the cost of KSF) compared with KSF.

It is believed that the reason for the increase in CASN and YAG usage is that due to less blue excitation light reaching the second phosphor layer, more CASN and YAG phosphor is required to generate red and green light to attain the required target color.

As described above, the reduction in KSF usage is a result of locating the KSF in a separate layer that is in contact with (adjacent to) the LED chips. It is believed that the reason for this reduction in KSF usage amount, is that in a single-layer LED-filament Dev.2 comprising a single photoluminescence layer comprising a mixture of KSF (manganese-activated fluoride photoluminescence material), CASN and YAG, the various photoluminescence materials have equal exposure to blue excitation light. Since KSF has a much lower blue light absorption capability than YAG and CASN materials, a greater amount of KSF is necessary to convert enough blue light to the required red emission. By contrast, in the double-layer LED-filament Dev.3, the KSF (manganese-activated fluoride photoluminescence material) in its separate respective first layer is exposed to blue excitation light individually without competition from the YAG and CASN; thus, more of the blue excitation light can be absorbed by the KSF. Since the KSF can more effectively convert the blue excitation light to red emission, the amount (usage) of KSF (narrowband red photoluminescence material) required to achieve a target color point can be reduced compared with LED-filaments comprising a single-layer comprising a mixture of photoluminescence materials.

As will be further noted from TABLE 7A, the content ratio of the CASN (broadband red photoluminescence material) with respect to the total of the KSF (narrowband red photoluminescence material) and CASN in the double-layer LED-filament Dev.3 is greater than about 30 wt %.

TABLE 8

Measured optical characteristics of 150 lm,
2700 K LED-filaments Dev. 2 and Dev. 3

| Filament | Flux (lm) | Br (%) | lm/W | CIE x | CIE y | CCT (K) | Ra | R8 | R9 |
|---|---|---|---|---|---|---|---|---|---|
| Dev. 2 | 154.5 | 100.0 | 150.0 | 0.4595 | 0.4103 | 2702 | 90.5 | 91.8 | 76.9 |
| Dev. 3 | 159.2 | 103.0 | 154.3 | 0.4591 | 0.4113 | 2716 | 93.1 | 87.3 | 67.3 |

Dev.4 is a further double-layer LED-filament in accordance with the invention and is a nominal 250 lm (1.5 W) device that is intended to generate white light with a target Correlated Color Temperature (CCT) of 2700K and a target general color rendering index CRI Ra of 90. It will be appreciated that four of these LED-filaments can be used to provide a 1000 lm LED-filament lamp using for example the embodiment of FIGS. 1A and 1B. LED-filament Dev.4 comprises a 52 mm by 3.0 mm porous silica substrate with a transmittance 40% having twenty five serially connected 714 (8 mil×27 mil) blue LED chips of dominant wavelength $\lambda_d$=454 nm mounted on a front face.

TABLE 9 tabulates phosphor compositions of the double-layer LED-filament Dev.4. As can be seen from TABLE 9, in terms of phosphor composition the double-layer LED-filament Dev.4 comprises on the front face of the substrate a first layer comprising KSF only (23.1 wt % of the total phosphor content of the front face) and a second layer comprising a mixture of 7.5 wt % CASN615 and 69.4 wt % YAG543. On a back face of the substrate a mixture of 9.1 wt % CASN615 and 90.9 wt % YAG535.

TABLE 9

Phosphor composition of a 250 lm double-layer LED-filament Dev.4

| | wt % photoluminescence material | | | | |
|---|---|---|---|---|---|
| | Front face | | | Back face | |
| Filament | KSF | CASN615 | YAG543 | CASN615 | YAG535 |
| Dev.4 | 23.1 | 7.5 | 69.4 | 9.1 | 90.9 |

TABLES 10A and 10B tabulate the phosphor amounts (mg) of the double-layer LED-filament Dev.4. The phosphor weight values (weight) in TABLES 10A and 10B are normalized phosphor weight normalized to the weight of KSF of a single-layer LED-filament using the same photoluminescence materials. As can be seen from TABLE 10A a double-layer structured LED-filament reduces KSF usage nearly 80% by weight (0.1956 compared with 1.0000) compared with a single-layer structured LED-filament and nearly 90% by weight compared with known LED-filaments that comprise KSF on the front and back faces. As will be further noted from TABLE 10A, the content ratio of the CASN (broadband red photoluminescence material) with respect to the total of the KSF (narrowband red photoluminescence material) and CASN in the double-layer LED-filament Dev.4 is about 25 wt %.

TABLE 10A

Phosphor amount of 250 lm double-layer LED-filament Dev. 4

| | Front face - Phosphor amount | | | | |
|---|---|---|---|---|---|
| | KSF | | CASN615 | YAG543 | Total | CASN/(CASN + KSF) |
| Filament | weight | % | weight | weight | weight | (wt %) |
| Dev. 4 | 0.1956 | 19.6 | 0.0642 | 0.7012 | 0.9610 | 24.7 |

TABLE 10B

Phosphor amount of a double-layer LED-filament Dev.4

| | Phosphor amount | | | |
|---|---|---|---|---|
| | Back face | | | |
| | CASN615 | YAG535 | Total | Total weight |
| Filament | weight | weight | weight | Front & Back |
| Dev.4 | 0.0493 | 0.3764 | 0.4257 | 1.3867 |

TABLE 11 tabulates the measured optical performance of the double-layer LED-filament Dev.4. The data includes measurements immediately after switching the filament on (referred to as Instantaneous or COLD measurement) and after the filament has reached thermal stability (referred to as HOT measurement) after a period of about 3 minutes operation. Test data has shown that double-layer structured LED-filament enable production of LED-filaments having a CRI Ra greater than 90 and an optical performance which is greater (5% to 10%) than known LED-filament with a CRI Ra of only 80.

TABLE 11

Measured optical characteristics of a nominal
250 lm, 2700 K double-layer LED-filament Dev. 4

| Test Condition | $I_F$ (mA) | $V_F$ (V) | Flux (lm) | lm/W | CIE x | CIE y | CCT (K) | CRI Ra Ra | R8 | R9 |
|---|---|---|---|---|---|---|---|---|---|---|
| Cold (C) | 20.0 | 68.6 | 252.0 | 183.8 | 0.4556 | 0.4148 | 2793 | 92.5 | 83.5 | 59.3 |
| Hot (H) | 20.0 | 67.3 | 234.7 | 174.4 | 0.4553 | 0.4094 | 2756 | 93.4 | 83.6 | 61.2 |
| Δ C to H for $I_F$ = 20 mA | 0.0 | −1.3 | 93% | 95% | −0.0004 | −0.0054 | −37 | +0.9 | +0.1 | +1.9 |
| Hot (H) | 22.0 | 67.4 | 254.5 | 171.6 | 0.4552 | 0.4089 | 2753 | 93.4 | 83.5 | 61.1 |
| Hot (H) | 25.0 | 67.6 | 282.9 | 167.3 | 0.4552 | 0.4083 | 2748 | 93.4 | 83.4 | 61.0 |

Experimental Data—Single-Layer Structured
LED-Filament Inc. Light Scattering Layer Single-layer LED-filament (Dev.5—comparative device) and Single-layer LED-filaments including a light scattering layer in accordance with the invention (Dev.6 to Dev.8) each comprise a 52 mm by 1.5 mm porous silica substrate with a transmittance 40% having twenty five serially connected 1025 (10 mil×25 mil) blue LED chips of dominant wavelength $\lambda_d$=456 nm mounted on a front face. Each LED-filament is a nominal 250 lm (1.5 W) device and is intended to generate white light with a target Correlated Color Temperature (CCT) of 3000K and a target general color rendering index CRI Ra of 90. LED-filament Dev.5 has the single-layer structure of FIG. 2C while LED-filaments Dev.6 to Dev.8 have the single-layer structure of FIG. 7D.

The photoluminescence materials (phosphors) used in the test devices are KSF phosphor ($K_2SiF_6:Mn^{4+}$) from Intematix Corporation, CASN phosphors ($Ca_{1-x}Sr_xAlSiN_3$: Eu $\lambda_{pe}$≈615 nm, 631 nm and 650 nm), and green YAG phosphors (Intematix GYAG4156 and GYAG542—(Y, Ba)$_{3-x}$(Al$_{1-y}$Ga$_y$)$_5$O$_{12}$:Ce$_x$ Peak emission wavelength $\lambda_{pe}$=542 nm and 550 nm).

The red and green phosphors were mixed in a phenyl silicone and the mixture dispensed onto the substrate.

TABLE 12 tabulates phosphor composition (wt % photoluminescence material) of comparative single-layer LED-filament without light scattering layer Dev.5 and single-layer LED-filaments including a light scattering layer Dev.6 to Dev.8.

As can be seen from TABLE 12, in terms of phosphor composition LED-filament Dev.5 comprises, on the front face of the substrate, a mixture of 77.0 wt % KSF, 2.0 wt % CASN615 and 21.0 wt % YAG542 and on a back face of the substrate a mixture of 5 wt % CASN (1.4 wt % CASN631+ 3.6 wt % CASN650) and 95 wt % YAG550. Each of LED-filaments Dev.6 to Dev.8 comprise no phosphor on the back face of the substrate. As can be seen from TABLE 12, in terms of phosphor composition the LED-filament Dev.6 comprises on the front face of the substrate a mixture of 75.4 wt % KSF, 1.6 wt % CASN615 and 23.0 wt % YAG542; LED-filament Dev.7 comprises on the front face of the substrate a mixture of 76.0 wt % KSF, 1.4 wt % CASN615 and 22.6 wt % YAG542; and LED-filament Dev.8 comprises on the front face of the substrate a mixture of 77.7 wt % KSF, 0.7 wt % CASN615 and 21.6 wt % YAG542.

TABLE 12

Phosphor composition of 250 lm single-layer LED-filaments Dev. 5 to Dev. 8

| | wt % photoluminescence material | | | | | |
|---|---|---|---|---|---|---|
| | Front face | | | Back face CASN | | |
| Filament | KSF | CASN615 | YAG542 | CASN631 | CASN650 | YAG550 |
| Dev. 5 | 77.0 | 2.0 | 21.0 | 1.4 | 3.6 | 95.0 |
| Dev. 6 | 75.4 | 1.6 | 23.0 | — | — | — |
| Dev. 7 | 76.0 | 1.4 | 22.6 | — | — | — |
| Dev. 8 | 77.7 | 0.7 | 21.6 | — | — | — |

TABLES 13A and 13B tabulate the phosphor amounts (usage) of the single-layer LED-filament without light scattering layer Dev.5 and the single-layer LED-filament including a light scattering layer Dev.6 to Dev.8. The phosphor weight values (weight) in TABLES 13A and 13B are normalized phosphor weights that are normalized to the weight of KSF of the single-layer LED-filament Dev.5.

By comparing the phosphor amounts for single-layer LED-filaments Dev.6 to Dev.8 including a light scattering layer with those of single-layer LED-filament Dev.5, it is to be noted the inclusion of a light scattering layer substantially reduces not only KSF usage but also reduces CASN and YAG usage and that the magnitude of the reduction in phosphor usage is related to the wt % loading of light scattering material (TiO$_2$) to light transmissive binder material in the light scattering layer. This result is to be compared with the double-layer LED-filament (Dev.3) that substantially reduced KSF usage but substantially increased CASN and YAG usage (TABLES 7A and 7B).

As can be seen from TABLE 13A and comparing LED-filament Dev.6 with LED-filament Dev.5, the provision of a light scattering layer with a 0.4 wt % loading of TiO$_2$ to silicone: (i) reduces KSF usage (front face) by about 36% by weight (0.6396 compared with 1.0000), (ii) reduces CASN usage (front face) by about 48% by weight (0.0133 compared with 0.0255), (iii) reduces YAG usage (front face) by about 28% by weight (0.1947 compared with 0.2721), and (iv) reduces total phosphor usage on the front face of the substrate by about 35% by weight (0.8476 compared with 1.2976). Moreover, it will be further noted from TABLE 13B that when taking into account that there is no phosphor on the back face of the substrate of Dev.6, the overall reduction in total phosphor usage (front and back faces) is about 60% by weight (0.8476 compared with 2.1122).

As can be seen from the tables for an LED-filament Dev.7 with a 1.0% wt % loading of $TiO_2$, this reduces KSF usage by about 59% by weight (0.4075 compared with 1.0000) and reduces total phosphor usage (front and back faces) by about 75% by weight (0.5297 compared with 2.1122) and for an LED-filament Dev.8 with a light scattering layer with a 2.0% wt % loading of $TiO_2$ this reduces KSF usage by about 67% by weight (0.3308 compared with 1.0000) and reduces total phosphor usage (front and back faces) by about 67% by weight (0.4230 compared with 2.1122).

As will be further seen from the tables the provision of a light scattering layer reduces the content ratio of the broadband red photoluminescence material (e.g. CASN) with respect to the total red photoluminescence material content (i.e. narrowband red photoluminescence material+broadband red photoluminescence material) in the LED-filament with the amount of reduction increasing with increasing $TiO_2$ weight loading. For example, for Dev.5 the CASN content ratio is 2.5 wt %, for Dev.6 the content ratio is 2.0 wt % ($TiO_2$ 0.4 wt %), for Dev.7 the content ratio is 0.2 wt % ($TiO_2$ 1.0 wt %), and for Dev.8 the content ratio is 0.1 wt % ($TiO_2$ 2.0 wt %). This is to be contrasted with the double-layer structure LED-filament without a light scattering layer (Dev.3) which showed an increase in content ratio to 31.5 wt % compared with a content ratio of 2.9 wt % for a single-layer structured LED-filament (Dev.2)—TABLE 7A. In some embodiments, for a balance of off-state white visual appearance and optical performance, the content ratio of broadband red photoluminescence material with respect to the total red photoluminescence material in the LED-filament can be from about 0.1 wt % to about 0.5 wt %.

As described herein, not only does the inclusion of a light scattering layer reduce overall phosphor usage, it also improves the off-state white appearance of the LED-filament. For example, in an off-state: LED-filament Dev.5 is bright yellow to orange in color; LED-filament Dev.6 is slightly yellowy white in color; LED-filament Dev.7 is slightly off-white in color; and LED-filament Dev.8 is white in color.

TABLE 13A

Phosphor/$TiO_2$ amount of 250 lm single-layer LED-filaments Dev. 5 to Dev. 8 weight - weight normalized to weight of KSF of LED-filament Dev. 5

| | Front face - Phosphor amount | | | | | | | | | |
|---|---|---|---|---|---|---|---|---|---|---|
| | KSF | | CASN615 | | YAG543 | | Total | | CASN/(CASN + KSF) | $TiO_2$ |
| Filament | Weight | % | Weight | % | Weight | % | Weight | % | Reduction | (wt %) | (wt %) |
| Dev. 5 | 1.0000 | 100 | 0.0255 | 100 | 0.2721 | 100 | 1.2976 | 100 | 0% | 2.5 | 0 |
| Dev. 6 | 0.6396 | 64 | 0.0133 | 52 | 0.1947 | 72 | 0.8476 | 65 | 35% | 2.0 | 0.4 |
| Dev. 7 | 0.4075 | 41 | 0.0008 | 29 | 0.1214 | 45 | 0.5297 | 41 | 59% | 0.2 | 1.0 |
| Dev. 8 | 0.3308 | 33 | 0.0003 | 11 | 0.0919 | 34 | 0.4230 | 33 | 67% | 0.1 | 2.0 |

TABLE 13B

Phosphor/$TiO_2$ amount of 250 lm single-layer LED-filaments Dev. 5 to Dev. 8 weight - phosphor weight normalized to weight of KSF of LED-filament Dev. 5

| | Back face - Phosphor weight | | | | Front and Back - Total phosphor weight | | | $TiO_2$ |
|---|---|---|---|---|---|---|---|---|
| Filament | KSF | CASN | YAG535 | Total | Weight | % | reduction | (wt %) |
| Dev. 5 | — | 0.0408 | 0.7754 | 0.8162 | 2.1122 | 100 | 0 | 0 |
| Dev. 6 | — | — | — | — | 0.8476 | 40 | 60% | 0.4 |
| Dev. 7 | — | — | — | — | 0.5297 | 25 | 75% | 1.0 |
| Dev. 8 | — | — | — | — | 0.4230 | 20 | 80% | 2.0 |

TABLE 14 tabulates the measured optical performance of single-layer LED-filaments Dev.5 to Dev.8. The data are for a drive current $I_F$=20 mA and drive voltage $V_F$≈67 V and are after 3 minutes of operation once the filament had reached thermal stability.

As described herein, while an increase in $TiO_2$ loading in the light scattering layer increases the reduction in phosphor usage, it also decreases the light brightness.

As can be seen by comparing each of LED-filaments Dev.6 to Dev.8 with Dev.5, each LED-filament generates light with substantially the same optical characteristics (CIE x, CIE y, CRI Ra, CRI R9). It will be noted that the brightness of light (BR), and luminous efficacy of LED-filaments Dev.6 to Dev.8 decreases with increasing $TiO_2$ loading in the light scattering layer. For example, comparing LED-filament Dev.6 with Dev.5, Dev.6 generates light of substantially the same quality but with a reduction in brightness and luminous efficacy of about 2% (98.0% compared with 100.0%). It is to be noted that while LED-filament Dev.6 has a small 2% reduction in brightness and luminous efficacy, the provision of the light scattering layer with a 0.4 wt % loading of $TiO_2$ has resulted in a substantial reduction in total phosphor usage of 60% and improvement in the visual appearance of the filament from bright yellow to orange in color to slightly yellowy white in color.

Comparing LED-filament Dev.7 with Dev.5, Dev.7 generates light of substantially the same quality but with a reduction in brightness of about 6.4% (93.6% compared with 100.0%) and a reduction in luminous efficacy of about 5.5% (94.5% compared with 100.0%). It is to be noted that while LED-filament Dev.7 has a relatively small (about 6%) reduction in brightness and luminous efficacy, the provision of the light scattering layer with a 1.0 wt % loading of $TiO_2$ has resulted in a vast 75% reduction in total phosphor usage and improvement in the visual appearance of the filament from bright yellow to orange in color to slightly off-white in color.

Comparing LED-filament Dev.8 with Dev.5, Dev.8 generates light of substantially the same quality but with a reduction in brightness of about 17% (83.0% compared with 100.0%) and a reduction in luminous efficacy of about 16.1% (83.9% compared with 100.0%). It is to be noted that while LED-filament Dev.8 has about a 17% reduction in brightness and luminous efficacy, the provision of the light scattering layer with a 2.0 wt % loading of $TiO_2$ has resulted in a massive 80% reduction in total phosphor usage and improvement in the visual appearance of the filament from bright yellow to orange in color to white in color.

It will be appreciated that while the reduction in luminous efficacy is dependent on $TiO_2$ loading in the light scattering layer, the reduction will also depend on the thickness of the light scattering layer. For example, a thinner light scattering layer with a higher loading of light scattering material can achieve a similar result and vice versa. It is anticipated that loading of light scattering material to light transmissive binder may be from 0.1 wt % to 5 wt %.

TABLE 14

Measured optical characteristics of 250 lm, 3000 K LED-filaments Dev. 5 to Dev. 8

| Filament | Flux (lm) | Br (%) | Efficacy lm/W | % | CIE x | CIE y | CCT (K) | CRI Ra | CRI R9 | $TiO_2$ (wt %) |
|---|---|---|---|---|---|---|---|---|---|---|
| Dev. 5 | 256.7 | 100.0 | 191.6 | 100 | 0.4359 | 0.4071 | 3043 | 92.9 | 72.1 | 0 |
| Dev. 6 | 251.5 | 98.0 | 188.7 | 98.0 | 0.4317 | 0.4074 | 3118 | 90.4 | 67.9 | 0.4 |
| Dev. 7 | 240.3 | 93.6 | 181.1 | 94.5 | 0.4387 | 0.4084 | 3006 | 90.4 | 67.8 | 1.0 |
| Dev. 8 | 213.0 | 83.0 | 160.8 | 83.9 | 0.4401 | 0.4103 | 2998 | 92.3 | 82.9 | 2.0 |

Preliminary tests suggest that a double-layer LED-filament including a light scattering layer (0.4 wt % $TiO_2$) compared with a single-layer LED-filament without a light scattering layer (e.g. Dev.5) provide about an 80% reduction by weight in KSF and about a 100% increase by weight in green to red photoluminescence material (YAG, CASN) giving an overall reduction in phosphor usage of about 30% to 40% by weight. This is to be compared with the double-layer filament (Dev.4) without light scattering layer that compared with a single-layer LED-filament without a light scattering layer (Dev.2) used 80% by weight less KSF and about a 200% increase by weight in green to red photoluminescence material (YAG, CASN) giving an overall increase in phosphor usage of about 30% by weight.

Embodiments of the invention thus concern improvements relating to the LED-filaments and LED-filament lamps and in particular, although not exclusively, reducing the cost of manufacture of LED-filaments without compromising on brightness and CRI Ra.

As used in this document, and as customarily used in the art, terms of approximation, including the words "substantially" and "about," are defined to mean normal variations in the dimensions and other properties of finished goods that result from manufacturing tolerances and other manufacturing imprecisions, and the normal variations in the measurement of such dimensions and other properties of finished goods.

While the invention has been described in detail, it will be apparent to one skilled in the art that various changes and modifications can be made and equivalents employed, without departing from the present invention. It is to be understood that the invention is not limited to the details of construction, the arrangements of components, and/or the method set forth in the above description or illustrated in the drawings. Statements in the abstract of this document, and any summary statements in this document, are merely exemplary; they are not, and cannot be interpreted as, limiting the scope of the claims. Further, the figures are merely exemplary and not limiting. Topical headings and subheadings are for the convenience of the reader only. They should not and cannot be construed to have any substantive significance, meaning or interpretation, and should not and cannot be deemed to indicate that all of the information relating to any particular topic is to be found under or limited to any particular heading or subheading. Therefore, the invention is not to be restricted or limited except in accordance with the following claims and their legal equivalents.

What is claimed is:

1. An LED-filament comprising:
   a partially light transmissive substrate;
   a plurality of LED chips on a front face of the substrate;
   a photoluminescence material layer comprising at least one broadband green to red photoluminescence material that is in direct contact with and covers each of the plurality of LED chips; and
   a light scattering layer comprising particles of a light scattering material that is in direct contact with and covers the photoluminescence material layer and at least a part of a back face of the substrate,
   wherein there is no photoluminescence material layer on the back face of the substrate; and
   wherein light emitted from the LED-filament is emitted through the light scattering layer covering the photoluminescence material layer and the at least the part of the back face of the substrate.

2. The LED-filament of claim 1, wherein the light scattering layer comprises respective light scattering layers constituting a front and back face of the LED-filament.

3. The LED-filament of claim 1, wherein the light scattering material is white in color.

4. The LED-filament of claim 1, wherein, in an off-state, the LED-filament is substantially the color of the light scattering material.

5. The LED-filament of claim 1, wherein the light scattering material is selected from the group consisting of: zinc oxide (ZnO), titanium dioxide ($TiO_2$), barium sulfate ($BaSO_4$), magnesium oxide (MgO), silicon dioxide ($SiO_2$), aluminum oxide ($Al_2O_3$), zirconium dioxide ($ZrO_2$), and mixtures thereof.

6. The LED-filament of claim 1, wherein the photoluminescence material layer comprises a narrowband red photoluminescence material.

7. The LED-filament of claim 6, wherein the photoluminescence material layer comprises a single layer comprising the at least one broadband green to red photoluminescence material and the narrowband red photoluminescence material.

8. The LED-filament of claim 6, wherein the photoluminescence material layer comprises:
   a first layer comprising the narrowband red photoluminescence material that is in direct contact with and covers each of the plurality of LED chips; and
   a second layer comprising the at least one broadband green to red photoluminescence material that is in direct contact with and covers the first layer, and
   wherein the light scattering layer is in direct contact with and covers the second layer.

9. The LED-filament of claim 6, wherein the narrowband red photoluminescence material is at least one phosphor selected from the group consisting of: $K_2SiF_6:Mn^{4+}$, $K_2GeF_6:Mn^{4+}$, and $K_2TiF_6:Mn^{4+}$.

10. An LED-filament lamp comprising:
    an LED-filament comprising:
    a partially light transmissive substrate;
    a plurality of LED chips on a front face of the substrate;
    a photoluminescence material layer comprising at least one broadband green to red photoluminescence material that is in direct contact with and covers each of the plurality of LED chips; and
    a light scattering layer comprising particles of a light scattering material that is in direct contact with and covers the photoluminescence material layer and at least a part of a back face of the substrate,
    wherein there is no photoluminescence material layer on the back face of the substrate; and
    wherein light emitted from the LED-filament is emitted through the light scattering layer covering the photoluminescence material layer and the at least the part of the back face of the substrate.

11. The light emitting device of claim 10, wherein the light scattering material is white in color.

12. The LED-filament lamp of claim 10, wherein the light scattering layer comprises respective light scattering layers constituting a front and back face of the LED-filament.

13. The LED-filament lamp of claim 10, wherein the light scattering material is selected from the group consisting of: zinc oxide (ZnO), titanium dioxide ($TiO_2$), barium sulfate ($BaSO_4$), magnesium oxide (MgO), silicon dioxide ($SiO_2$), aluminum oxide ($Al_2O_3$), zirconium dioxide ($ZrO_2$), and mixtures thereof.

14. The LED-filament lamp of claim 10, wherein the photoluminescence material layer comprises a narrowband red photoluminescence material.

15. The LED-filament lamp of claim 14, wherein the photoluminescence material layer comprises a single layer comprising the at least one broadband green to red photoluminescence material and the narrowband red photoluminescence material.

16. The LED-filament lamp of claim 14, wherein the photoluminescence material layer comprises:
    a first layer comprising the narrowband red photoluminescence material that is in direct contact with and covers each of the plurality of LED chips; and
    a second layer comprising the at least one broadband green to red photoluminescence material that is in direct contact with and covers the first layer, and
    wherein the light scattering layer is in direct contact with and covers the second layer.

17. The LED-filament lamp of claim 14, wherein the narrowband red photoluminescence material is at least one phosphor selected from the group consisting of: $K_2SiF_6:Mn^{4+}$, $K_2GeF_6:Mn^{4+}$, and $K_2TiF_6:Mn^{4+}$.

\* \* \* \* \*